(12) United States Patent
Rampley et al.

(10) Patent No.: US 12,362,294 B2
(45) Date of Patent: Jul. 15, 2025

(54) WAFER WITH SEMICONDUCTOR DEVICES AND INTEGRATED ELECTROSTATIC DISCHARGE PROTECTION

(71) Applicant: NXP USA, Inc., Austin, TX (US)

(72) Inventors: Colby Greg Rampley, Phoenix, AZ (US); Bruce McRae Green, Gilbert, AZ (US); David Cobb Burdeaux, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 448 days.

(21) Appl. No.: 17/338,078

(22) Filed: Jun. 3, 2021

(65) Prior Publication Data

US 2022/0392856 A1 Dec. 8, 2022

(51) Int. Cl.
| | | |
|---|---|---|
| H01L 23/60 | (2006.01) | |
| H01L 21/78 | (2006.01) | |
| H10D 30/01 | (2025.01) | |
| H10D 30/47 | (2025.01) | |
| H10D 62/824 | (2025.01) | |
| H10D 62/85 | (2025.01) | |

(52) U.S. Cl.
CPC .............. *H01L 23/60* (2013.01); *H01L 21/78* (2013.01); *H10D 30/015* (2025.01); *H10D 30/475* (2025.01); *H10D 62/824* (2025.01); *H10D 62/8503* (2025.01)

(58) Field of Classification Search
None
See application file for complete search history.

(56) References Cited

U.S. PATENT DOCUMENTS

| | | |
|---|---|---|
| 7,427,787 B2 | 9/2008 | Steinhoff |
| 7,825,487 B2 | 11/2010 | Velladis et al. |
| 8,237,192 B2 | 8/2012 | Sorg et al. |
| 8,258,012 B2 | 9/2012 | Pagaila et al. |
| 8,749,015 B2 | 6/2014 | Disney et al. |
| 8,809,961 B2 | 8/2014 | Tsai et al. |
| 9,780,559 B2 | 10/2017 | Suzuki et al. |
| 10,134,722 B2 | 11/2018 | Yam et al. |
| 2003/0202307 A1 | 10/2003 | Hung et al. |
| 2009/0278236 A1* | 11/2009 | Sato .................... H01L 23/3121 257/E23.179 |
| 2010/0295100 A1* | 11/2010 | Huang ................. H10D 64/251 257/256 |

(Continued)

FOREIGN PATENT DOCUMENTS

| | | |
|---|---|---|
| CN | 105390490 B | 11/2018 |
| DE | 102004007655 B4 | 3/2013 |
| JP | 5056658 B2 | 10/2012 |

*Primary Examiner* — Khaja Ahmad

(57) ABSTRACT

A wafer includes a substrate that includes a channel layer, a first active region, a second active region, and a saw street region between the first active region and the second active region. The wafer includes a first device formed on the substrate in the first active region. The first device includes a first portion of the channel layer. The wafer includes a second device formed on the substrate in the second active region. The second device includes a second portion of the channel layer. The wafer includes a conductive channel between the first active region and the second active region. The conductive channel is in the saw street of the wafer and includes a third portion of the channel layer.

14 Claims, 16 Drawing Sheets

(56) References Cited

U.S. PATENT DOCUMENTS

| | | | | |
|---|---|---|---|---|
| 2012/0175777 A1* | 7/2012 | Hill | .................. | H01L 21/76898 |
| | | | | 257/E23.141 |
| 2013/0288401 A1* | 10/2013 | Matsuura | ............ | H01L 29/4175 |
| | | | | 438/14 |
| 2015/0123168 A1* | 5/2015 | Green | ................. | H01L 27/0629 |
| | | | | 257/192 |
| 2015/0162309 A1* | 6/2015 | Vincent | ................... | H01L 24/97 |
| | | | | 438/109 |
| 2017/0140939 A1* | 5/2017 | Kurachi | ............. | H01L 29/2003 |
| 2018/0350933 A1* | 12/2018 | Huang | ................ | H01L 27/0629 |

\* cited by examiner

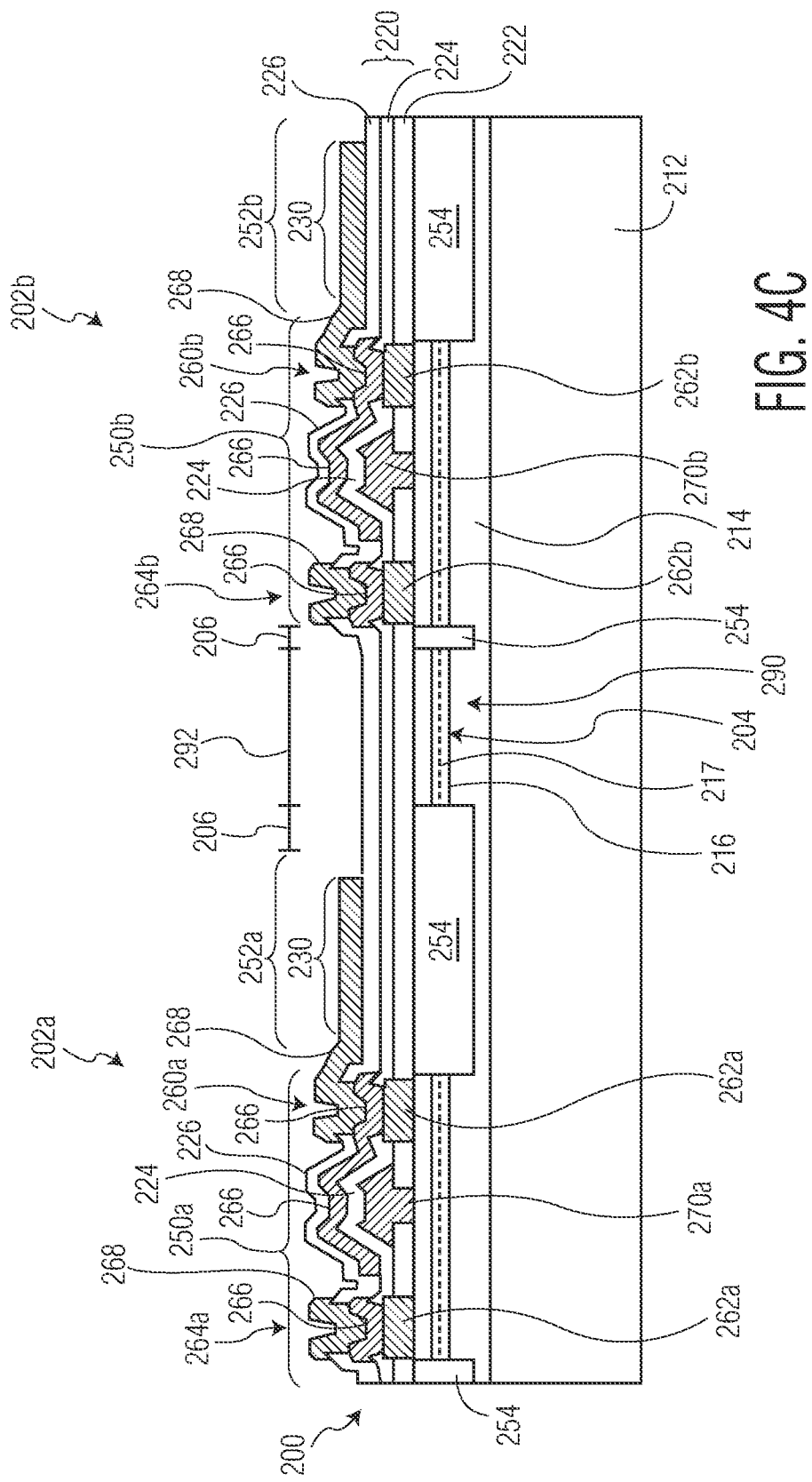

US 12,362,294 B2

WAFER WITH SEMICONDUCTOR DEVICES AND INTEGRATED ELECTROSTATIC DISCHARGE PROTECTION

TECHNICAL FIELD

This disclosure relates generally to structures and methods for dissipation of electrostatic charge in a semiconductor wafer, and more specifically, to a wafer configuration that incorporates a conductive grid to provide charge distribution across the wafer.

BACKGROUND

Semiconductor devices can be fabricated on insulative substrates. During device fabrication, such substrates can sometimes accumulate charge in the substrate itself and in the devices formed or being formed on or in the substrate. If sufficient charge is accumulated, the charge can be suddenly dissipated, potentially resulting in damage to the devices being fabricated on the substrate. Such discharge may result during the manufacturing of devices or during back-end wafer processing such as during substrate thinning or wafer singulation. In some cases, when wafer singulation occurs via sawing, for example, the sawing process can promote the build-up of such electrostatic charge in the substrate.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 4A-4D depict cross-sectional views of a series of fabrication steps for forming the wafer and grid structure of FIG. 3.

DETAILED DESCRIPTION

The following sets forth a detailed description of various embodiments intended to be illustrative of the invention and should not be taken to be limiting.

Semiconductor devices find application in a wide variety of electronic components and systems. In some applications, devices, such as radio frequency (RF), microwave, and millimeter wave devices, are fabricated over substrates that includes electrically insulative semiconducting materials as part of a wafer. In gallium nitride (GaN) devices fabricated on silicon carbide (SiC) substrates, for example, the substrate can be sufficiently insulative and thus the substrate can accumulate electrostatic charge during fabrication and die singulation. If sufficient charge is accumulated, the charge can discharge suddenly potentially causing damage to device components fabricated over the wafer's substrate.

The present disclosure provides an approach for constructing a conductive grid structure around devices being fabricated in a wafer, where the wafer includes an electrically insulative semiconducting substrate. The grid structure may be formed around each individual device of the wafer and allows electrostatic charges being accumulated within the wafer to be evenly distributed across the wafer. The charge may then be dissipated through a ground reference that is electrically connected to the grid structure.

The grid structure may be formed using doping, activation, and/or isolation techniques applied to a wafer substrate during device fabrication. As such, the grid structure may not include a metallic conductive structure and may instead be a conductive structure formed in the wafer's semiconducting material. In a specific embodiment, the grid structure is formed during a GaN isolation process to be part of a two-dimensional electron gas (2-DEG) layer of the GaN substrate. The grid structure may be electrically isolated from each of the devices on the wafer. Or, alternatively, the grid structure may be electrically connected to one or more of the devices, such as to a common body or other suitable terminal component of the devices, to provide a grounding terminal for the devices during fabrication.

Figure 1:
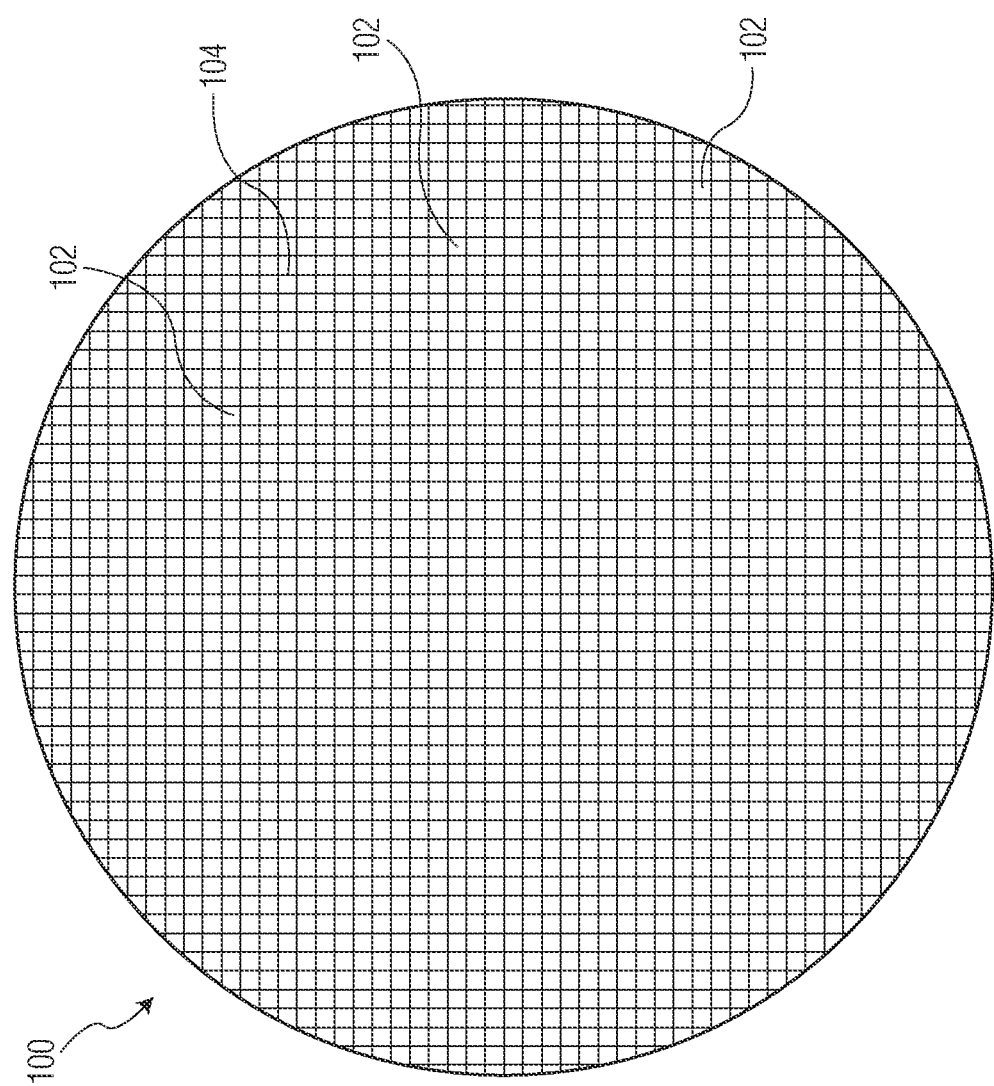
FIG. 1 depicts a top view of a semiconductor wafer that includes a number of devices formed therein.

FIG. 1 depicts a top view of a semiconductor wafer 100 that includes a number of devices 102. Each device 102 is formed within active regions of wafer 100 and includes electrical circuitry and components formed on or within wafer 100. Grid structure 104 is formed over or within wafer 100. Grid structure 104 includes a number of crisscrossing conductive elements that are arranged to form a conductive mesh within wafer 100. Grid structure 104 includes a number of square or rectangular conductive elements with central openings (though in other embodiments, grid structure 104 may comprise a number of differently-shaped elements, such as circular, oval, or other regular and irregular shaped elements). Each device 102 of wafer 100 is formed at least partially within an interior region of one of the square or rectangular-shaped elements of grid structure 104 so that each device 102 is at least partially surrounded by a portion of grid structure 104.

Although grid structure 104 is visible in the top view of wafer 100 as depicted in FIG. 1, it should be understood that grid structure 104 may be formed below a top surface of wafer 100 and so may not be visible in a top view of wafer 100. In fact, while devices 102 may be formed over a top surface of wafer 100, grid structure 104 may be formed underneath the top surface of wafer 100, as described herein.

Figure 2:
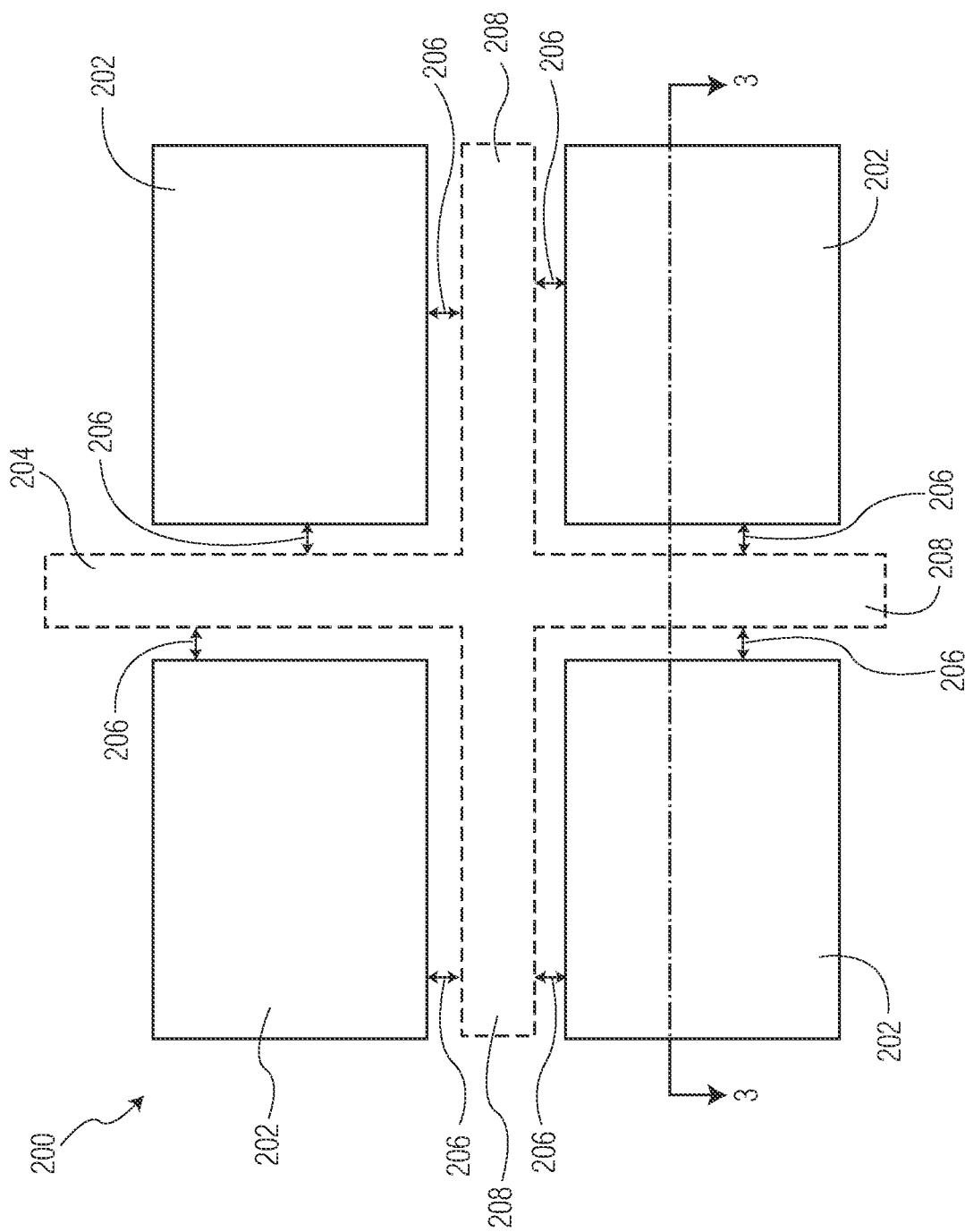
FIG. 2 is an enlarged and top-view illustration of a portion of a wafer over which a number of semiconductor devices are formed, according to an embodiment.

To provide further illustration of the relationship between grid structure 104 and the individual devices 102 of wafer 100, FIG. 2 is an enlarged and top view illustration of a portion of wafer 200 (e.g., wafer 100, FIG. 1) over which a number of semiconductor devices 202 (e.g., devices 102, FIG. 1) are formed.

As seen in FIG. 2, grid structure 204 (e.g., grid structure 104, FIG. 1) is physically separated or isolated from the individual die 102 (prior to singulation) by a horizontal separation distance 206. Grid structure 204 is rendered in dashed lines because grid structure 204 is formed underneath or below the top surface of wafer 200. In typical embodiments, separation distance 206 can range from 5 µm to 10 µm, though greater or smaller separation distances 206 may be utilized depending upon the application. In general, separation distance 206 is selected to be compatible with subsequent processes such as saw and relevant design rules. In some embodiments, separation distance 206 may be the same for all regions of wafer 100 or separation distance 206 may vary in different regions of wafer 100 or in proximity to particular types of devices 202 on wafer 200. Separation distance 206 may be adjusted based on the type of devices 202 being fabricated in particular regions of wafer 100.

Grid structure 204 includes a number of grid elements 208 that intersect with one another to form the grid configuration of grid structure 204. Grid elements 208 are arranged so that each device 202 of wafer 200 is surrounded or at least partially surrounded (when viewed by the top view depicted in FIG. 2) by a continuous grid element 208 structure running around a perimeter of each device 202 and the active areas of wafer 200 in which the device 202 is formed. Grid elements 208 of grid structure 204 are generally electrically conductive and may include a conductive material or comprise a region of wafer 200 that is itself generally conductive. For example, grid elements 208 may include a region of wafer 100 such as a portion of a 2-DEG region or layer of wafer 100 that is conductive. In other embodiments, grid elements 208 may be formed around multiple devices 202 and/or multiple active regions of wafer 200. For example, grid elements 208 may surround or envelop multiple devices 202 (e.g., two to four devices 202, or more) arranged in a row or column, or grouped in a two dimensional array of devices 202 where at least one side of each device 202 is adjacent a grid element 208 of grid structure 204. Alternatively grid elements 208 may envelop an entire row or column of devices 202 within wafer 200.

Figure 3:
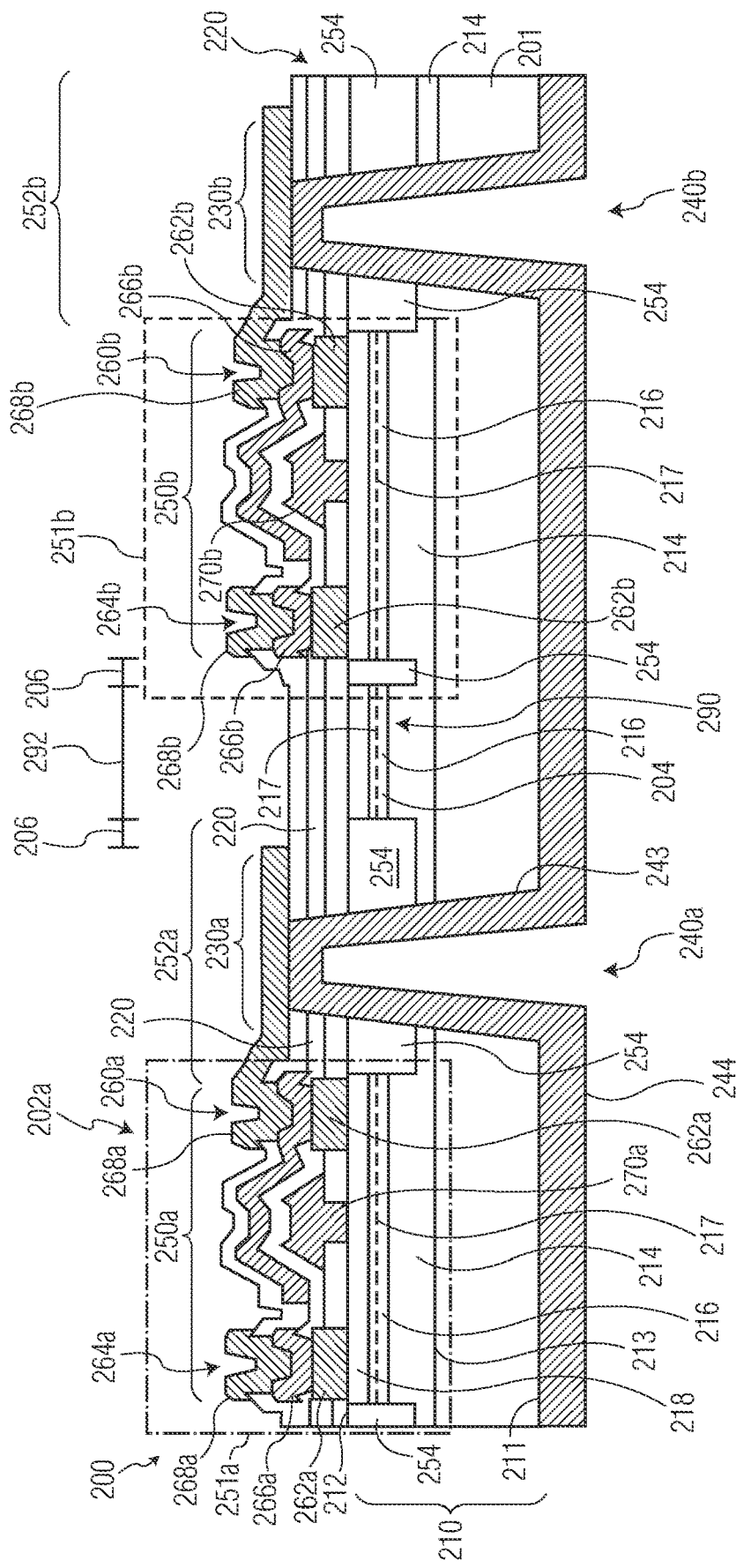
FIG. 3 is a cross-sectional side view of a portion of a wafer taken along line 3-3 of FIG. 2 showing details of a grid structure.

FIG. 3 is a cross-sectional side view of a portion of wafer 200 taken along line 3-3 of FIG. 2 showing details of grid structure 204. Wafer 200 includes substrate 210 that includes an upper surface 212 and a lower substrate surface 211. Two devices 202a and 202b (e.g., devices 102, 202 of FIGS. 1 and 2) are depicted formed on substrate 210. In an embodiment, devices 202a and 202b may include devices 251a and 251b (in this example, transistors), respectively, and/or other device(s) (embodiment not shown) formed within active regions 250a and 250b formed proximate the upper surface 212 of the substrate 210 and laterally adjacent the through wafer vias 240a and 240b. In other embodiments, any suitable electronic circuits, components, or devices may be formed within active regions 250a and 250b of wafer 200. As such, active regions 250a and 250b may comprise any type of device, component (active or passive), combination of components, or electrical circuit suited for formation within or upon wafer 100.

In this example, transistor structures 251a and 251b may be formed with a portion of the dielectric layers that comprise the insulating layer 220 and may include source electrodes 260a and 260b (i.e., "first current carrying electrodes") and drain electrodes 264a and 264b (i.e., "second current-carrying electrode"), both of which may be formed over and within the substrate 210, within the active regions 250a and 250b. The source electrodes 260a and 260b and drain electrodes 264a and 264b may be formed laterally adjacent the source electrodes 260a and 260b, within the active regions 250a and 250b, and may be coupled to a channel 217 formed within the substrate 210. Gate electrodes 270a and 270b (i.e., "control electrodes") may be formed over the substrate 210 and coupled to the active regions 250a and 250b between the source electrodes 260a and 260b and the drain electrodes 264a and 264b.

Wafer 200 includes an insulating layer 220. Via pads 230a and 230b (i.e., "first conductive region") may be formed over the insulating layer 220. Through-wafer vias 240a and 240b (i.e., "openings") may be formed within the substrate 210. Back metal layer 244 (i.e., "second conductive region") is formed within the through wafer vias 240a and 240b and on the lower surface 211 of the substrate 210.

In an embodiment, the substrate 210 may include an upper surface 212, a lower substrate surface 211, a host substrate 201, a buffer layer 214, a channel layer 216, a channel 217, and a barrier layer 218. In an embodiment, the host substrate 201 may include an upper surface 213 and may be formed from SiC or other materials such as sapphire, silicon (Si), aluminum nitride (AlN), diamond, boron nitride (BN), poly-SiC, silicon on insulator, indium phosphide (InP), and other substantially insulating or high resistivity materials. The buffer layer 214 may be formed on the upper surface 213 of host substrate 201. The buffer layer 214 may include one or more group III-N semiconductor layers and is supported by host substrate 201. The buffer layer 214 may include a multi-layer structure, wherein each of the semiconductor layers of buffer layer 214 may include an epitaxially grown group III nitride layer, for example. The epitaxially grown group-III nitride layers that make up buffer layer 214 may include nitrogen (N)-polar (i.e., N-face) or gallium (Ga)-polar (i.e., Ga-face) material, for example. In other embodiments, the semiconductor layer(s) of the buffer layer 214 may not be epitaxially grown. In still other embodiments, the semiconductor layer(s) of the buffer layer 214 may include Si, GaAs, InP, or other suitable materials.

Channel layer 216 may be formed over buffer layer 214. The channel layer 216 may include one or more group III-N semiconductor layers and is supported by buffer layer 214. The channel layer 216 may include an AlXGa1-XN layer where X takes on values between 0 and 1. In an embodiment, the channel layer 216 is configured as GaN (X=0) although other values of X may be used without departing from the scope of the inventive subject matter. The thickness of the channel layer 216 may be between about 50 angstroms and about 10,000 angstroms, though other thicknesses may be used. The channel layer 216 may be not intentionally doped (NID) or, alternatively, may include silicon (Si), germanium (Ge), carbon (C,) iron (Fe), chromium (Cr), or other suitable dopants. The dopant concentration may be between about $10^{16}$ and about $10^{19}$ cm$^{-3}$ though other higher or lower concentrations may be used. In other embodiments, channel layer 216 may include NID or doped InYGa1-YN, where Y, the indium mole fraction, may take a value between 0 and 1.

Barrier layer 218 may be formed over the channel layer 216, in accordance with an embodiment. The barrier layer 218 may include one or more group III-N semiconductor layers and may be supported by the channel layer 216. The barrier layer 218 may have a larger bandgap and/or larger spontaneous polarization than the channel layer 216 and, when the barrier layer 218 is over channel layer 216, the channel 217 may be created in the form of a two-dimensional electron gas (2-DEG) within channel layer 216 adjacent the interface between the channel layer 216 and the barrier layer 218. In addition, tensile strain between the barrier layer 218 and channel layer 216 may cause additional piezoelectric charge to be introduced into the 2-DEG and the channel 217. The 2-DEG formed in channel 217 is electrically conductive and, as described below, a portion of the 2-DEG in channel 217 is utilized to form the grid structure 204 of wafer 200. In embodiments, in which channel 217 includes the 2-DEG, channel 217 is conductive, but does not include any metal and instead may include only semiconducting materials.

The barrier layer 218 may include a multi-layer structure, where the first layer of the barrier layer 218 may include at least one NID AlXGa1-XN layer where X takes on values between 0 and 1. In some embodiments, X may take a value of 0.1 to 0.35, although other values of X may be used. The thickness of the first layer of the barrier layer 218 may be between about 50 angstroms and about 1000 angstroms though other thicknesses may be used. The barrier layer 218 may be NID or, alternatively, may include Si, Ge, C, Fe, Cr, or other suitable dopants. The dopant concentration may be between about $10^{16}$ and $10^{19}$ cm$^{-3}$ though other higher or lower concentrations may be used. There may be an additional AlN interbarrier layer (not shown) formed between the channel layer 216 and the barrier layer 218, in some embodiments. The AlN interbarrier layer may introduce additional spontaneous and piezoelectric polarization, increasing the channel charge and improving the electron confinement of the resultant 2-DEG that forms the channel 217. In other embodiments, the barrier layer 218 may include one or more indium aluminum nitride (InAlN) layers, denoted InYAl1-YN, where Y, the indium mole fraction, may take a value between about 0.1 and about 0.2 though other values of Y may be used. In the case of using InAlN to form the barrier layer 218, the thickness of the barrier layer 218 may be between about 50 angstroms and about 2000 angstroms though other thicknesses may be used. In the case of using InAlN to form the barrier layer 218, the InAlN may be NID or, alternatively, may include Si, Ge, C, Fe, Cr, or other suitable dopants. The dopant concentration may be between about $10^{16}$ cm$^{-3}$ and about $10^{19}$ cm$^{-3}$ though other higher or lower concentrations may be used.

Via pads 230a and 230b (first conductive layer) may be formed from one or more refractory metal layers and high conductivity metal layers formed over the insulating layer 220, according to an embodiment. The through-wafer vias 240a and 240b (opening) formed in the substrate 210 may extend from the lower substrate surface 211, through the upper substrate surface 212, and through at least a portion of the insulating layer 220, terminating on the via pads 230a and 230b, according to an embodiment.

In an embodiment, the back metal layer 244 (second conductive region) may be coupled to via pads 230a and 230b through through-wafer vias 240a and 240b. The back metal layer 244 may include an adhesion layer that contacts the lower substrate surface 211 and a primary conductive layer that contacts the adhesion layer. The adhesion layer may be selected from one or more of titanium (Ti), titanium tungsten (TiW), Cr, or other suitable low-stress materials. The adhesion layer may have a thickness between about 50 angstroms and about 2 microns, although other thicknesses may be used. The conductive layer may be selected from one or more of gold (Au), aluminum (Al), silver (Ag), copper (Cu), a combination of these, or other conductive material.

In an embodiment, the transistor structures 251a and 251b may be formed within the active regions 250a and 250b and may be formed proximate the upper substrate surface 212 and laterally adjacent the through-wafer vias 240a and 240b. Source electrodes 260a and 260b may be formed within the active regions 250a and 250b and electrically coupled to the channel 217, according to an embodiment. In an embodiment, drain electrodes 264a and 264b may be formed within the active regions 250a and 250b, laterally adjacent the source electrodes 260a and 260b, and electrically coupled to the active regions 250a and 250b. In an embodiment, gate electrodes 270a and 270b may be formed over substrate 210 and electrically coupled to channel 217 between source electrodes 260a and 260b and drain electrodes 264a and 264b within active regions 250a and 250b. At least a portion of the insulating layer 220 may be formed over the active regions 250a and 250b, according to an embodiment.

Active regions 250a and 250b are formed within substrate 210. One or more isolation regions 252a and 252b are formed within the substrate 210 to define active regions 250a and 250b proximate upper surface 212. Isolation regions 252a and 252b may be formed via an implantation procedure configured to damage the epitaxial and/or other semiconductor layers to create high resistivity regions 254 of the substrate 210, rendering the substrate 210 high resistivity or semi-insulating in high resistivity regions 254 while leaving the crystal structure intact in the active region 250. In other embodiments (not shown), isolation regions 252 may be formed by removing one or more of the epitaxial and/or other semiconductor layers of the substrate 210 in areas corresponding to the isolation regions 252, thus removing the channel 217 in the isolation regions 252, rendering the remaining layers of the substrate 210 semi-insulating and leaving behind active region 250a and 250b "mesas" surrounded by high resistivity or semi-insulating isolation regions 252.

Source electrodes 260a and 260b and drain electrodes 264a and 264b may be formed by connections through first and second interconnect metal 266a and 266b and 268a and 268b to ohmic contacts 262a and 262b electrically coupled to the substrate 210. In an embodiment, ohmic contacts 262a and 262b may be formed in openings in insulating layer 220. Ohmic contacts 262a and 262b may be electrically coupled to the channel 217 through the upper substrate surface 212 and the barrier layer 218.

Gate electrodes 270a and 270b (control electrode) may be formed over the substrate 210 in the active regions 250a and 250b. Gate electrodes 270a and 270b may be electrically coupled to the channel 217 through the upper substrate surface 212 and the barrier layer 218. Changes to the electric potential on gate electrodes 270a and 270b may shift the quasi-Fermi level for the barrier layer 218 compared to the quasi Fermi level for the channel layer 216 and thereby modulate the electron concentration in the channel 217 within the portion of the substrate 210 under the gate electrodes 270a and 270b.

Interconnect metals 266a and 266b may be electrically coupled to the source ohmic contacts 262a and 262b. First interconnect metal 266a and 266b may be formed over and electrically coupled to ohmic contacts 262a and 262b and may be electrically coupled to one or more of drain electrodes 264a and 264b, source electrodes 260a and 260b, and/or gate electrodes 270a and 270b. Second interconnect metal 268a and 268b may be formed over first interconnect metal 266a and 266b and may be electrically coupled to source electrode 260a and 260b and drain electrode 264a and 264b. In an embodiment, second interconnect metal 268a and 268b may be coupled to first interconnect metal 266a and 266b.

As illustrated in FIG. 3, channel 217, in which the conductive 2-DEG is generated to form a conductive channel, is between isolation region 252a of device 202a (e.g., one of the devices 202 of FIG. 2) and active region 250b of device 202b (e.g., a neighboring device 202 of FIG. 2). Channel 217 is interrupted by high resistivity regions 254 of the substrate 210. During formation of high resistivity regions 254, wafer 200 is masked to prevent the portion 290 of channel 217 between active devices 202 from being destroyed by the implantation process used to create high resistivity regions 254. Portion 290 of channel 217 forms a portion of a grid element (e.g., grid element 208) of grid structure 204 and, as described below, is located within the saw street 292 of wafer 200. During conventional fabrication processes, the masked implantation step that creates high resistivity regions 254 would ordinarily destroy portion 290 of channel 217. Accordingly, in the present device 200 the implantation step is modified to preserve portion 290 of channel 217.

Portion 290 of channel 217, being conductive, can therefore be connected to a ground reference voltage so that electrostatic charge that may build up within active areas 250a and 250b or otherwise within substrate 210 or elsewhere in wafer 200 during device fabrication or other processing of wafer 200 may dissipate into portion 290 of channel 217 from which the charge can safely be routed to the ground reference or otherwise distributed through the grid structure 204 and wafer 200. In this manner, localized or general charge build-up during device fabrication may be minimized or reduced.

With formation of devices 202a and 202b complete, wafer 200 is configured to be singulated to separate devices 202a and 202b into individual dice. This may be achieved by cutting, scoring, or sawing along the saw street region 292 of wafer 200 between devices 202a and 202b. As used herein, the term "cutting" includes cutting (e.g., mechanically or with lasers), scoring, sawing, and other suitable singulation techniques. When cutting through wafer 200 in region 292, electrostatic charge that may be generated during the cutting process (e.g., caused by the interaction of the cutting or sawing blade and wafer 200) can be dissipated through portion 290 of channel 217 to prevent electrostatic charge buildup in devices 202a and 202b. During this process, if the cutting instrument (e.g., a saw blade) is narrower (i.e., has a smaller saw kerf) than portion 290 of channel 217, some amount of portion 290 of channel 217 may remain on either side of the saw street region 292 after singulation.

FIGS. 4A-4D depict cross sectional views of a series of fabrication steps for forming wafer 200 of FIG. 3. It should be appreciated that the number and order of processing steps in embodiments of the method is exemplary and that other embodiments of the method may have more or fewer processing steps performed in the same or other orders without limitation.

Figure 4A:
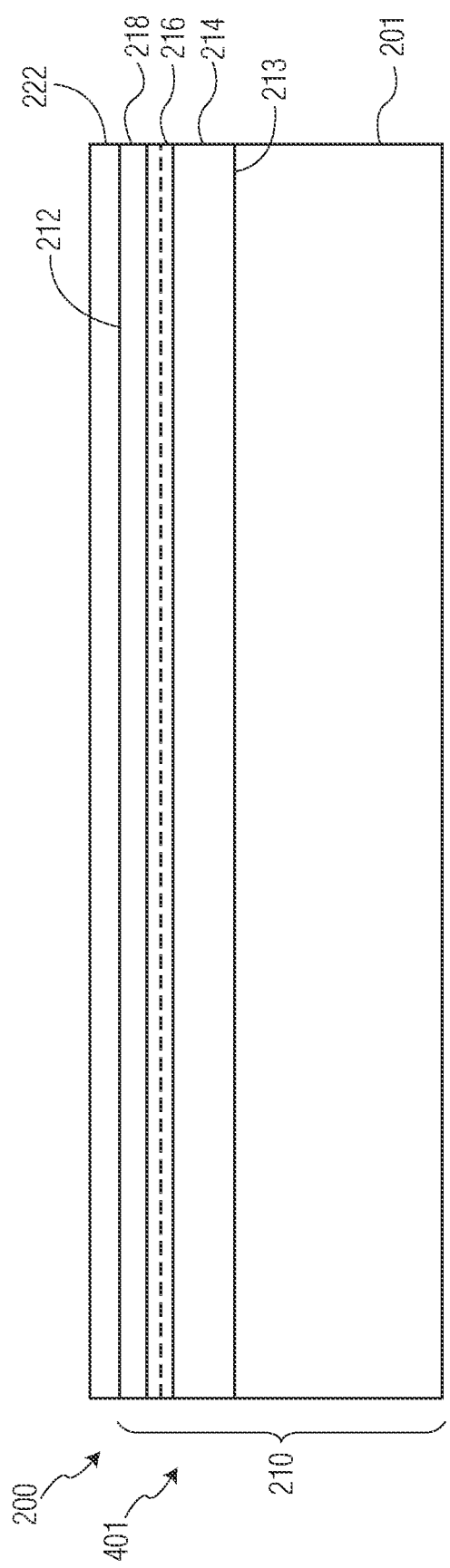

As depicted in FIG. 4A, substrate 210 is formed and dielectric layer 222 is deposited over the upper substrate surface 212. Forming the substrate 210 may include providing host substrate 201 and depositing buffer layer 214, channel layer 216, barrier layer 218, and a cap layer (not shown) over and on top of host substrate 201. Buffer layer 214 may be deposited on or over upper surface 213 of host substrate 201. Channel layer 216 is deposited on or over an upper surface of buffer layer 214. Barrier layer 218 is deposited on or over channel layer 216. A cap layer (not shown) may be deposited on or over the barrier layer 218. The cap layer may include GaN or other suitable materials. Each of buffer layer 214, channel layer 216, barrier layer 218, and the cap layer may be grown over upper surface 213 of host substrate 201 using one of metal-organo chemical vapor deposition (MOCVD), molecular beam epitaxy (MBE), hydride-vapor phase epitaxy (HYPE) or a combination of these techniques, though other suitable techniques may be used.

Dielectric layer 222 may include one or more layers of silicon nitride, SiO2, HfO2, Al2O3, diamond, poly-diamond, AlN, BN, SiC a combination of these or other insulating materials. The total thickness of the layer(s) used to form the dielectric layer 222 may be between about 100 angstroms and about 10,000 angstroms in thickness, although other thickness values may be used.

Figure 4B:
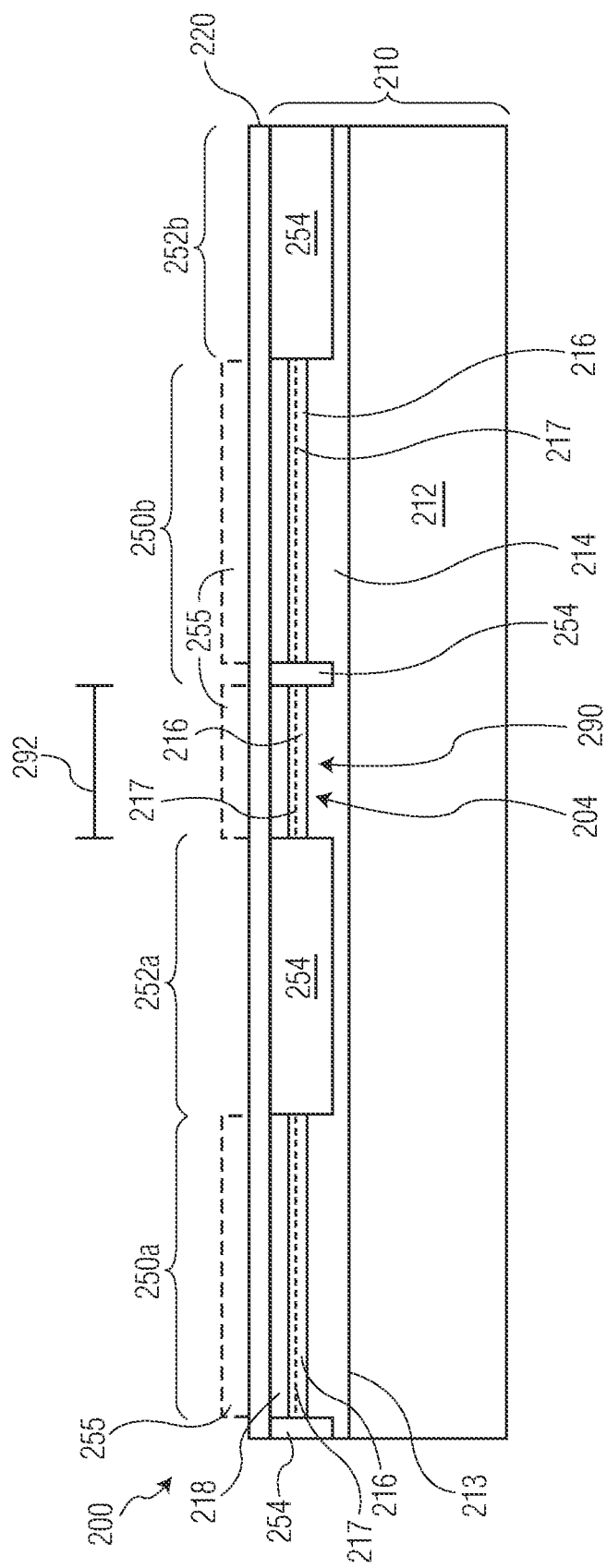
Figure 4D:
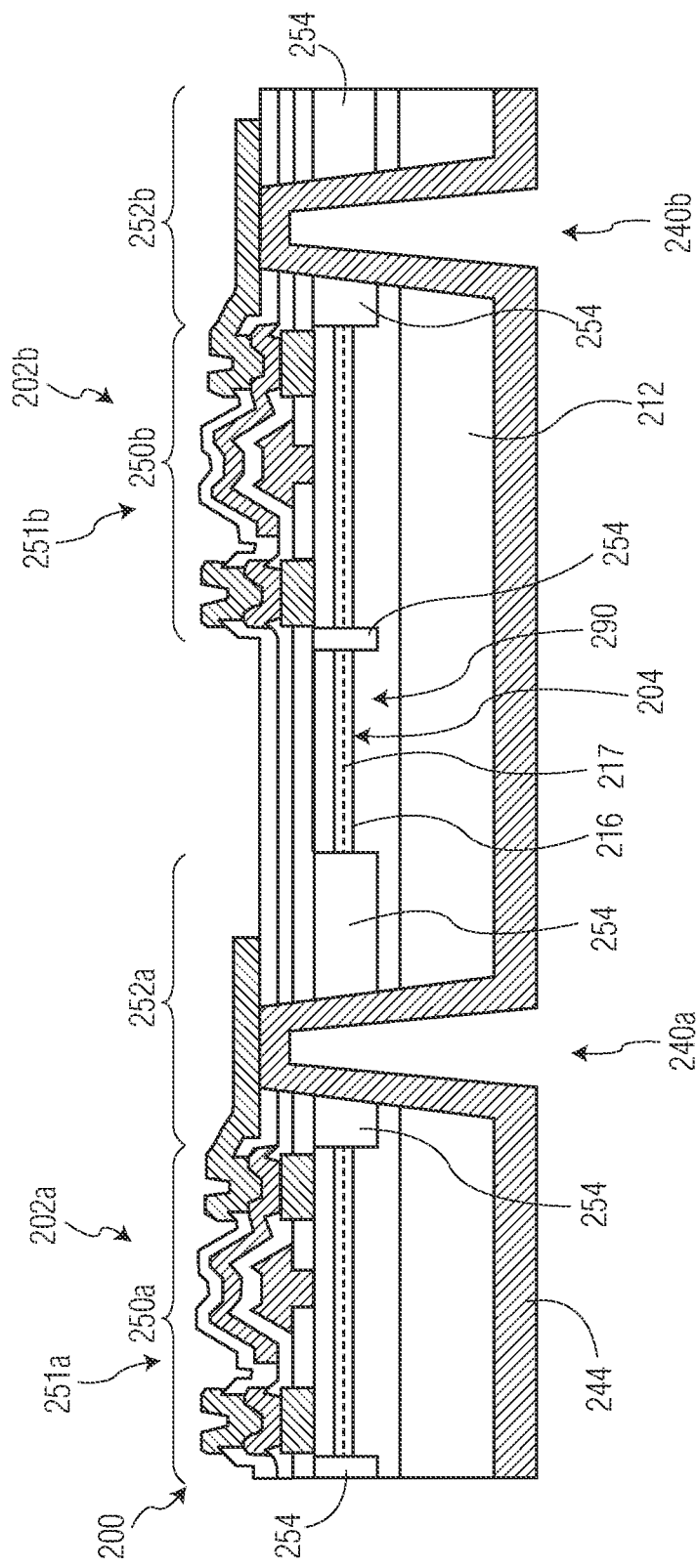

Referring now to FIGS. 4B-4D forming transistor structures 251a and 251b and grid structure 204 may include forming isolation regions 252a and 252b. Forming isolation regions 252a and 252b may include forming a masking layer 255 over the structure 401 of FIG. 4A and then implanting an ion species through dielectric layer 222 and into the substrate 210 to create the isolation regions 252a and 252b (see FIG. 4B) that define the active regions 250a and 250b. During this step, the masking layer 255 is configured and patterned to protect patterned areas of channel layer 216 so that portion 290 of channel 217 located within saw street 292 of wafer 200 is not destroyed during formation of the isolation regions 252a and 252b (and, specifically, formation of high resistivity regions 254). Implanting the ion species to form isolation regions 252a and 252b may include exposing unmasked or unprotected portions of the substrate 210 (e.g., those portions of substrate 210 that are not covered with portions of masking layer 255) to an appropriate dose of ion beam irradiation. According to an embodiment, the isolation regions 252a and 252b may be formed by implanting an ion species at an energy sufficient to drive the ion species through the dielectric layer 222 and into barrier layer 218, channel layer 216, and buffer layer 214, thus damaging the crystal lattice for these layers in regions that are not located beneath masking layer 255, disrupting the channel 217 within the isolation region 252a and 252b, and creating high resistivity regions 254 within the substrate 210. According to an embodiment, one of nitrogen (N), boron (B), helium (He), hydrogen (H), oxygen (O), or a combination of these or one or a combination of other suitable ion species may be implanted into the isolation regions 252a and 252b to create high resistivity regions 254 below the upper surface 212 of the substrate 210. After formation of isolation regions 252a and 252b, the masking layer 255 is removed using appropriate etchants or solvents.

The geometry of high resistivity regions 254 (as defined by the pattern of masking layer 255) determines the separation distance 206 between portion 290 of channel 217 and devices 202a and 202b.

In other embodiments (not shown), the isolation regions 252a and 252b (and, consequently, high resistivity regions 254) may be formed by removing (e.g., etching) dielectric layer 222, barrier layer 218, channel layer 216, and buffer layer 214 within the isolation regions 252a and 252b to remove the channel 217 within the isolation regions 252a and 252b. This etching process is controlled via masking so as to not remove any portion of channel 217 underlying saw street 292 portion of wafer 200. In these embodiments using etched isolation, the etching of semiconductor layers that overlie the host substrate 201 including barrier layer 218, channel layer 216, and buffer layer 214 may terminate within one of these layers. Alternatively, the etching may terminate on the upper surface 213 of the host substrate 201 or may extend into the host substrate 201, below the upper surface 213. In some embodiments, etching may be used in conjunction with ion implantation to create the active region 250 from the isolation region 252.

Referring to FIGS. 4C and 4D, formation of transistor structures 251a and 251b includes forming ohmic contacts 262a and 262b on substrate 210. Ohmic contacts 262a and 262b may be used to form the source electrodes 260a and 260b (see FIG. 3) and drain electrodes 264a and 264b (see FIG. 3). Gate electrodes 270a and 270b are formed over substrate 210. Insulating layer 220 may be formed by dielectric layers 222, 224, and 226. Second dielectric layer 224 is formed over gate electrodes 270a and 270b. Interconnect metal layers 266 and 268 are formed over second dielectric layer 224 and ohmic contacts 262a and 262b. Third dielectric layer 226 is formed over the second dielectric layer 224 and the interconnect metal layers 266 and 268.

Through-wafer vias 240a and 240b are formed within the substrate 201. Back metal layer 244 may be formed within the through-wafer vias 240a and 240b to electrically connect to source electrodes 260a and 260b.

The semiconductor wafer 200 including transistor devices 251a and 251b may then be further processed to singulate the devices 251a and 251b into individual die.

As illustrated in FIGS. 2, 3, and 4A-4D, grid structure 204 is separated from the devices 202 on wafer 200 by a separation distance 206 around a perimeter of devices 202. In such a configuration, no portion of grid structure 204 extends or is otherwise located underneath devices 202. In an alternate embodiment, however, a wafer may be configured so that at least a portion of a grid structure extends underneath devices formed on the wafer.

Figure 5:
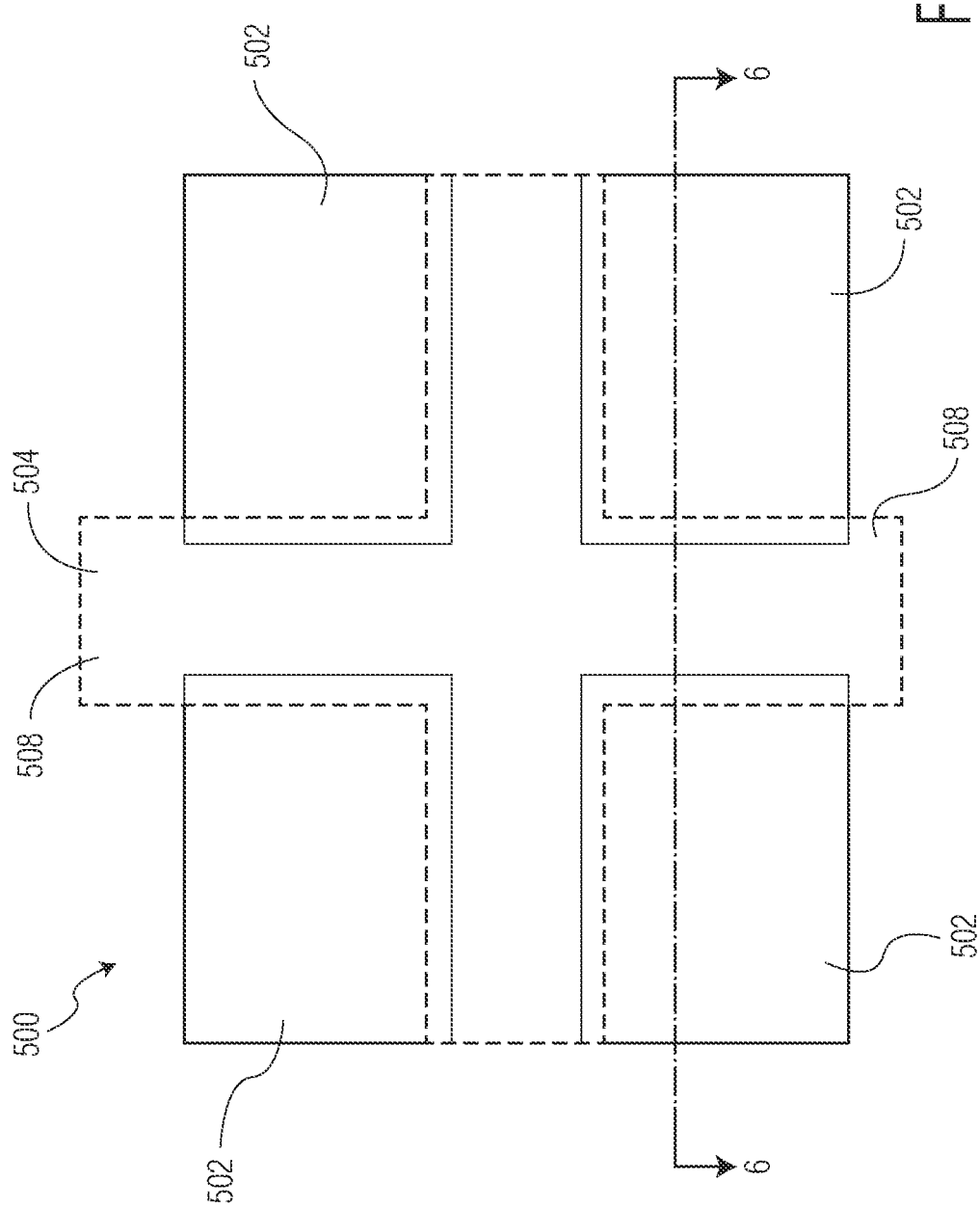
FIG. 5 is a zoomed-in illustration of a portion of a wafer over which a number of semiconductor devices are formed, according to an embodiment.

To illustrate, FIG. 5 is a zoomed-in illustration of a portion of wafer 500 over which a number of semiconductor devices 502 are formed. Grid structure 504 is arranged so that at least a portion of grid structure 504 extends underneath devices 502 in wafer 500. In typical implementations, grid structure 504 may extend underneath devices 502 and, in some cases, may be electrically connected to a common body of devices 502.

Grid structure 504 includes a number of grid elements 508 that intersect with one another to form the grid configuration of grid structure 504. Grid elements 508 are arranged so that a perimeter of each device 502 of wafer 500 is surrounded or at least partially surrounded by a continuous grid element 508 structure. In other embodiments, grid elements 508 may be formed around multiple devices 502 and/or multiple active regions of wafer 500. For example, grid elements 508 may surround or envelop multiple devices 502 (e.g., two to four devices 502, or more) arranged in a row or column, or grouped in a two dimensional array of devices 502 where at least one side of each device 502 is adjacent a grid element 508 of grid structure 504. Alternatively grid elements 508 may envelop an entire row or column of devices 502 within wafer 500. Grid elements 508 of grid structure 504 are generally electrically conductive and may comprise a region of wafer 500 that is itself generally conductive. For example, grid elements 508 may include a region of wafer 500, such as a portion of a 2-DEG region or layer of wafer 500 that is conductive.

Figure 6:
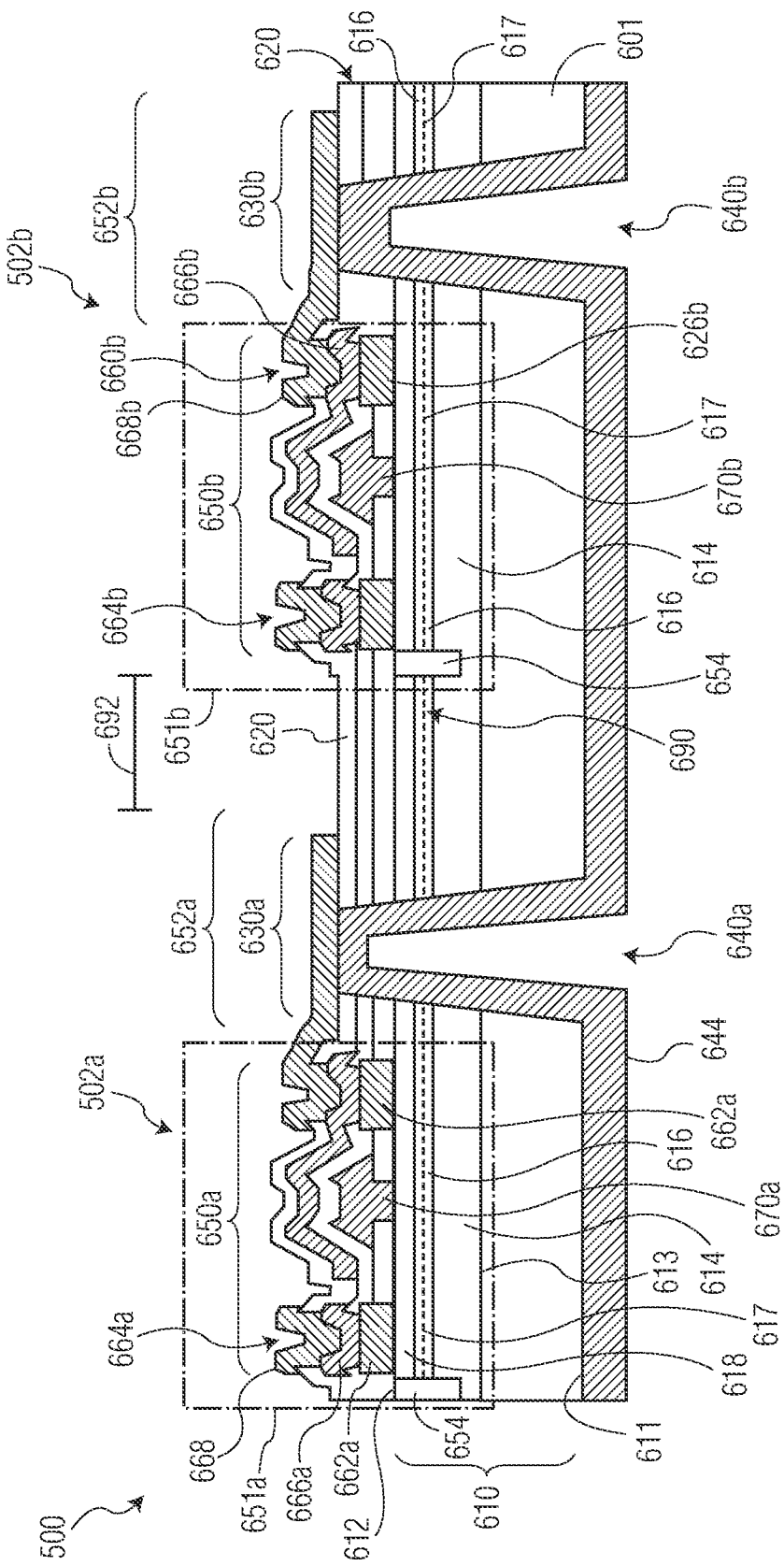
FIG. 6 is a cross-sectional side view of a portion of a wafer taken along line 5-5 of FIG. 5 showing details of a grid structure.

FIG. 6 depicts a cross sectional side view of a portion of wafer 500 taken along line 6-6 of FIG. 5 showing details of grid structure 504. Wafer 600 includes substrate 610 that includes an upper surface 612 and a lower substrate surface 611. Two devices 502a and 502b are depicted formed on substrate 610. In an embodiment, devices 502a and 502b may include transistor structures 651a and 651b, respectively, and/or other device(s) (embodiment not shown) formed within active regions 650a and 650b formed proximate the upper surface 612 of the substrate 610 and laterally adjacent the through wafer vias 640a and 640b. In other embodiments, any suitable electronic circuit(s), components, or devices may be formed within active regions 650a and 650b of wafer 500. As such, active regions 650a and 650b may comprise any type of device or electrical circuited suited for formation within or upon wafer 500.

In this example, transistor structures 651a and 651b may be formed with a portion of the dielectric layers that comprise the insulating layer 620 and may include source electrodes 660a and 660b (i.e., "first current carrying electrodes") and drain electrodes 664a and 664b (i.e., "second current-carrying electrode"), both of which may be formed over and within the substrate 610, within the active regions 650a and 650b. The source electrodes 660a and 660b and drain electrodes 664a and 664b may be formed laterally adjacent the source electrodes 660a and 660b, within the active regions 650a and 650b, and may be coupled to a channel 617 formed within the substrate 610. Gate electrodes 670a and 670b (i.e., "control electrodes") may be formed over the substrate 610 and coupled to the active regions 650a and 650b between the source electrodes 660a and 660b and the drain electrodes 664a and 664b.

In an embodiment, the substrate 610 may include an upper surface 612, a lower substrate surface 611, a host substrate 601, a buffer layer 614, a channel layer 616, a channel 617, and a barrier layer 618. In an embodiment, the host substrate 601 may include an upper surface 613 and may be formed from SiC or other materials such as sapphire, Si, GaN, AlN, diamond, BN, poly-SiC, silicon on insulator, GaAs, InP, and other substantially insulating or high resistivity materials. Buffer layer 614 may be formed on the upper surface 613 of host substrate 601 and may include one or more group III-N semiconductor layers.

Channel layer 616 is formed over buffer layer 614. Channel layer 616 may include one or more group III-N semiconductor layers and is supported by buffer layer 614. The channel layer 616 may include an $Al_XGa_{1-X}N$ layer where X takes on values between 0 and 1. In an embodiment, the channel layer 616 is configured as GaN (X=0) although other values of X may be used without departing from the scope of the inventive subject matter. The thickness of the channel layer 616 may be between about 50 angstroms and about 10,000 angstroms, though other thicknesses may be used. The channel layer 616 may be NID or, alternatively, may include Si, Ge, C, Fe, Cr, or other suitable dopants.

Barrier layer 618 is formed over the channel layer 616 and includes one or more group III-N semiconductor layers. Barrier layer 618 may have a larger bandgap and/or larger spontaneous polarization than the channel layer 616 and, when the barrier layer 618 is over channel layer 616, the channel 617 may be created in the form of a two-dimensional electron gas (2-DEG) within channel layer 616 adjacent the interface between the channel layer 616 and the barrier layer 618. In addition, tensile strain between the barrier layer 618 and channel layer 616 may cause additional piezoelectric charge to be introduced into the 2-DEG and the channel 617. The 2-DEG formed in channel 617 is electrically conductive and, as described below, a portion of the 2 DEG in channel 617 is utilized to form the grid structure 504 of wafer 500.

The barrier layer 618 may include a multi-layer structure, where the first layer of the barrier layer 618 may include at least one NID $Al_XGa_{1-X}N$ layer where X takes on values between 0 and 1. There may be an additional AlN interbarrier layer (not shown) formed between the channel layer 216 and the barrier layer 218, in some embodiments. The AlN interbarrier layer may introduce additional spontaneous and piezoelectric polarization, increasing the channel charge and improving the electron confinement of the resultant 2-DEG that forms the channel 617. In other embodiments, the barrier layer 618 may include one or more indium aluminum nitride (InAlN) layers, denoted InYAl1-YN, where Y, the indium mole fraction, may take a value between about 0.1 and about 0.2 though other values of Y may be used. In the case of using InAlN to form the barrier layer 618, the thickness of the barrier layer 618 may be between about 50 angstroms and about 2000 angstroms though other thicknesses may be used. In the case of using InAlN to form the barrier layer 618, the InAlN may be NID or, alternatively, may include Si, Ge, C, Fe, Cr, or other suitable dopants. The dopant concentration may be between about $10^{16}$ cm$^{-3}$ and about $10^{19}$ cm$^{-3}$ though other higher or lower concentrations may be used.

Wafer 100 may include an insulating layer 620 over the upper surface 612 of the substrate 610. Via pads 630a and 630b (i.e., "first conductive region") may be formed over the insulating layer 620. Through-wafer vias 640a and 640b (i.e., "openings") may be formed within the substrate 610. Back metal layer 644 (i.e., "second conductive region") is formed within the through wafer vias 640a and 640b and on the lower surface 611 of the substrate 610. In an embodiment, the back metal layer 644 (second conductive region) may be coupled to via pads 630a and 630b through the through-wafer vias 640a and 640b.

In an embodiment, transistor structures 651a and 651b may be formed within active regions 650a and 650b and may be formed proximate the upper substrate surface 612 and laterally adjacent the through-wafer vias 640a and 640b. Source electrodes 660a and 660b (i.e., "first current-carrying electrode") may be formed within the active regions 650a and 650b and electrically coupled to the channel 617, according to an embodiment. In an embodiment, drain electrodes 664a and 664b (i.e., "second current-carrying electrode") may be formed within the active regions 650a and 650b, laterally adjacent the source electrodes 660a and 660b, and electrically coupled to the active region 650a and 650b. In an embodiment, gate electrodes 670a and 760b (i.e., "control electrode") may be formed over the substrate 610 and electrically coupled to the channel 617 between the source electrodes 660a and 660b and drain electrodes 664a and 664b within the active regions 650a and 650b. At least a portion of the insulating layer 620 may be formed over the active regions 650a and 650b, according to an embodiment.

Active regions 650a and 650b may be formed within the substrate 610. One or more isolation regions 652 may be formed within the substrate 610 to define the active regions 650a and 650b proximate the upper surface 612, according to an embodiment. The isolation regions 652a and 652b may be formed via an implantation procedure configured to damage the epitaxial and/or other semiconductor layers to create high resistivity regions 654 of the substrate 610, rendering the substrate 610 high resistivity or semi-insulating in high resistivity regions 654 while leaving the crystal structure intact in the active regions 650a and 650b. In other embodiments (not shown), isolation regions 652a and 652b may be formed by removing one or more of the epitaxial and/or other semiconductor layers of the substrate 610 in areas corresponding to the isolation regions 652a and 652b, thus removing a portion of channel 617 in the isolation regions 652a and 652b, rendering the remaining layers of the substrate 610 semi-insulating and leaving behind active region 650 "mesas" surrounded by high resistivity or semi-insulating isolation regions 652.

In an embodiment, electrode 660a and 660b and drain electrodes 664a and 664b (first and second current-carrying electrodes) may be formed by connections through first and second interconnect metal 666a and 666b and 668a and 668b to ohmic contacts 662a and 662b electrically coupled to the substrate 610. In an embodiment, ohmic contacts 662a and 662b may be formed in openings in the insulating layer 620. Ohmic contacts 662a and 662b may be electrically coupled to channel 617 through the upper substrate surface 612 and barrier layer 618.

Gate electrodes 670a and 670b (control electrode) may be formed over the substrate 610 in the active regions 650a and 650b. Gate electrodes 670a and 670b may be electrically coupled to channel 617 through upper substrate surface 612 and barrier layer 618. Changes to the electric potential on gate electrodes 670a and 670b may shift the quasi-Fermi level for the barrier layer 618 compared to the quasi-Fermi level for the channel layer 616 and thereby modulate the electron concentration in the channel 617 within the portion of the substrate 610 under the gate electrodes 670a and 670b.

First interconnect metals 666a and 666b may be electrically coupled to the source ohmic contacts 662a and 662b. In an embodiment, first interconnect metals 666a and 666b may be formed over and electrically coupled to ohmic contacts 662a and 662b and may be electrically coupled to one or more of drain electrodes 664a and 664b, source electrodes 660a and 660b, and/or gate electrodes 670a and 670b. Second interconnect metal 668a and 668b may be formed over first interconnect metal 666a and 666b and may be electrically coupled to source electrode 660a and 660b and drain electrode 664a and 664b. In an embodiment, second interconnect metals 668a and 668b may be coupled to first interconnect metals 666a and 666b.

As illustrated in FIG. 6, channel 617, in which the conductive 2-DEG is formed, is not contiguous throughout wafer 600. High resistivity regions 654 are masked during formation so that a portion 690 of channel 617 between active regions 650a and 650b is not destroyed by the implantation process used to create high resistivity regions 654. Portion 690 of channel 617 forms a portion of a grid element of grid structure 604. Portion 690 of channel 617, being conductive, can therefore be connected to a ground reference voltage so that electrostatic charge that may build up within active areas 650a and 650b or otherwise within substrate 610 during device fabrication may dissipate into portion 690 of channel 617 where the charge can safely be routed to the ground reference. In this manner, charge build-up during device fabrication may be minimized or reduced.

In this embodiment, because portion 690 of channel 617 is connected, via a portion of back metal layer 644, to source electrodes 660a and 660b, the grid structure 604 across the entire wafer 500 can be connected to a ground reference voltage by coupling the source electrode 660 of one device 502 on wafer 500 to that ground reference voltage. Alternatively (or in addition), the grid structure 604 across the entire wafer 500 can be connected to a ground reference voltage by coupling the back metal layer 644 to that ground reference voltage. Consequently, a single electrical connection (either front side—via source electrode 660, back side—via back metal layer 644, or both) may be established to a single device 502 on wafer 500 in order to ground the entire grid structure 504. Although a single electrical connection may be used to ground grid structure 504 in a typical application, source electrodes 660 of a number of devices 502 on wafer 500 may be coupled to a desired reference voltage in order to ground grid structure 504. The number of device 502 that may be coupled to a desired reference voltage may be determined based upon an anticipated demand for current flow through grid structure 504.

After completion of the formation of devices 502a and 502b, wafer 500 is configured to be singulated to separate devices 502a and 502b into individual dice. This may be achieved by cutting, scoring, or sawing along the portion of wafer 500 between devices 502a and 502b. This region is indicated in FIG. 6 as region 292 and is referred to as the saw street of wafer 500. When cutting through wafer 500 in region 692, electrostatic charge that may be generated during the cutting process (e.g., caused by the interaction by the cutting or sawing blade and wafer 500) can be dissipated through portion 690 of channel 617 to prevent electrostatic charge buildup in devices 502a and 502b.

FIGS. 7A-7D depict cross-sectional views of a series of fabrication steps for forming the wafer 500 of FIG. 6. It should be appreciated that the number and order of processing steps in embodiments of the method is exemplary and that other embodiments of the method may have more or fewer processing steps performed in the same or other orders without limitation.

Figure 7A:
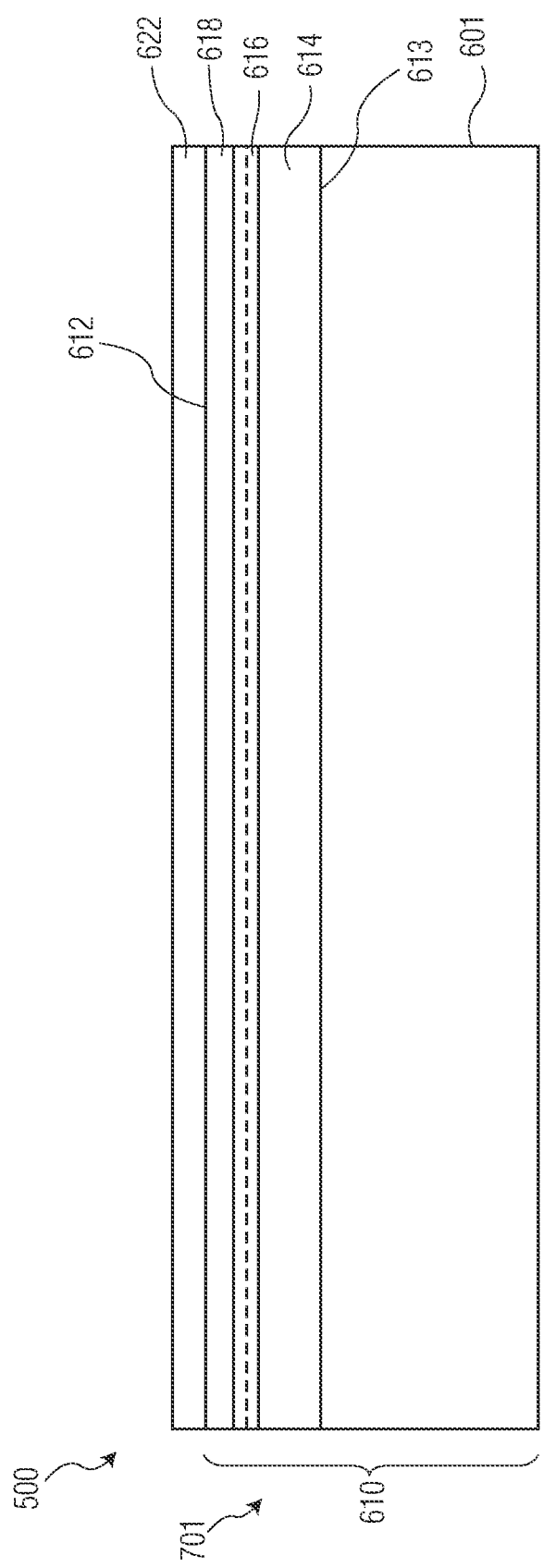
FIGS. 7A-7D depict cross-sectional views of a series of fabrication steps for forming the wafer and grid structure of FIG. 6.

As depicted in FIG. 7A, substrate 610 is formed and first dielectric layer 622 is deposited over the upper substrate surface 612. Forming the substrate 610 may include providing host substrate 601 and depositing the buffer layer 614, the channel layer 616, the barrier layer 618, and a cap layer (not shown) over and on top of the host substrate 601. Buffer layer 614 may be deposited on or over an upper surface 613 of the host substrate 601. Channel layer 616 is deposited on or over an upper surface of the buffer layer 614. Barrier layer 618 is deposited on or over channel layer 616. A cap layer (not shown) may be deposited on or over the barrier layer 618. The cap layer may include GaN or other suitable materials. Each of buffer layer 614, channel layer 616, barrier layer 618, and the cap layer may be grown over an upper surface 613 of host substrate 601 using one of MOCVD, MBE, HVPE or a combination of these techniques, though other suitable techniques may be used.

Dielectric layer 622 may include one or more layers of silicon nitride, SiO2, HfO2, Al2O3, diamond, poly-diamond, AlN, BN, SiC a combination of these or other insulating materials. The total thickness of the layer(s) used to form the first dielectric layer 622 may be between about 100 angstroms and about 10,000 angstroms in thickness, although other thickness values may be used.

Figure 7B:
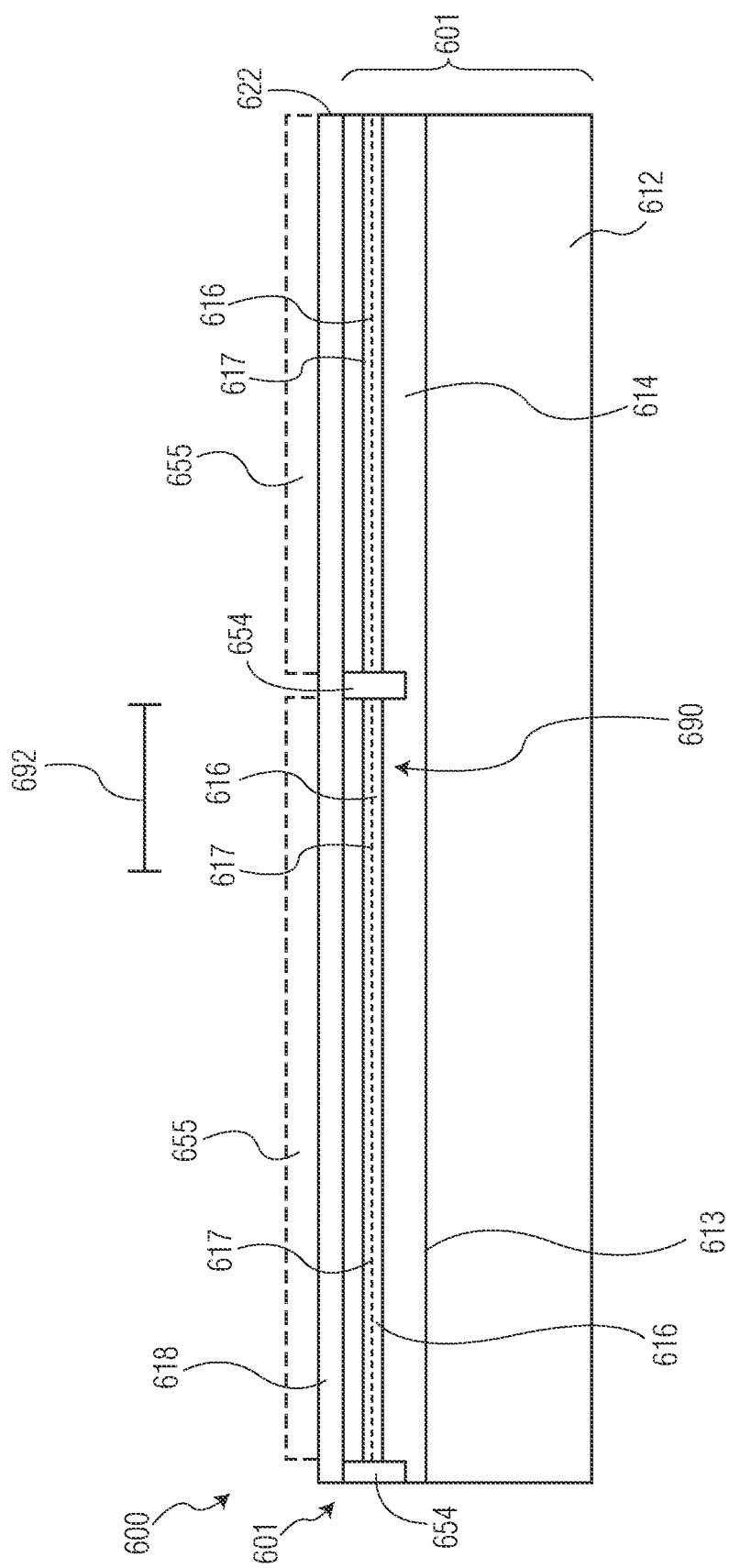
Figure 7C:
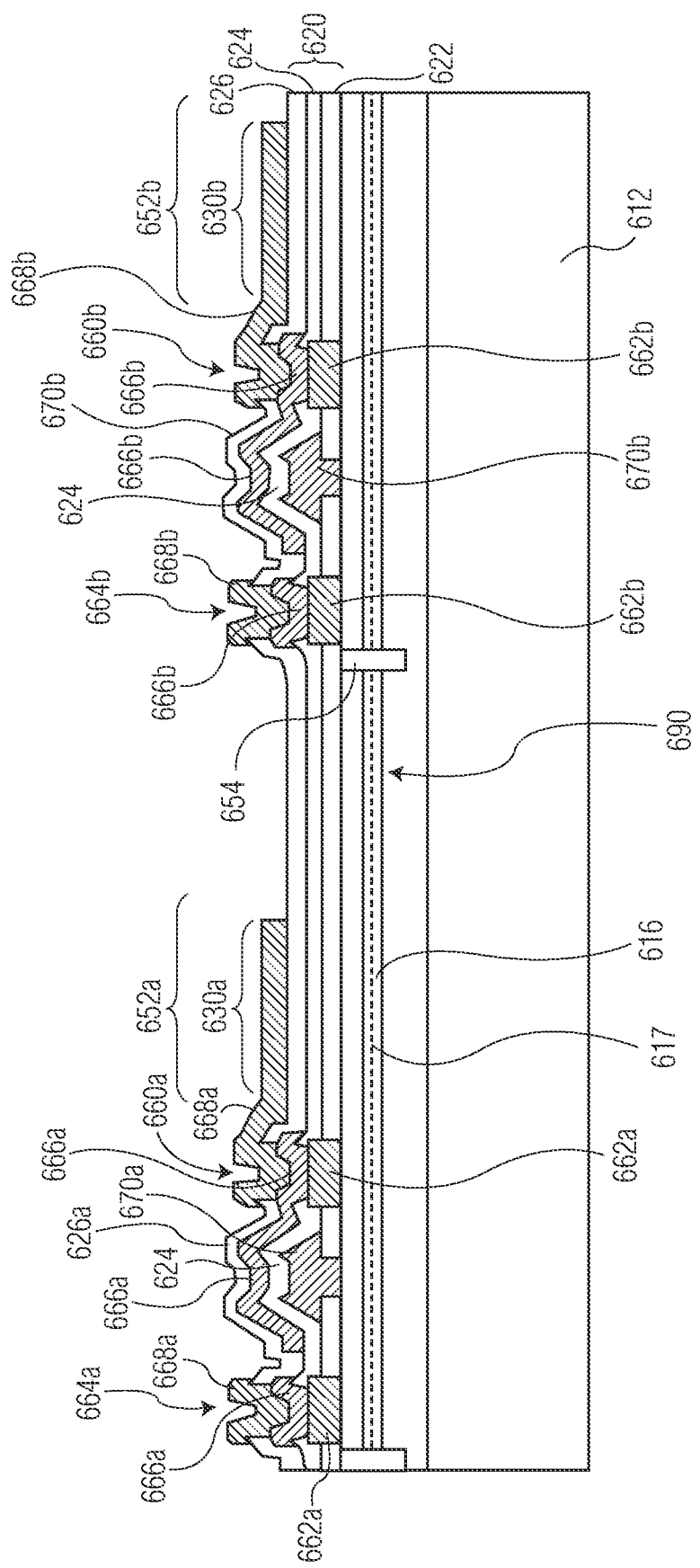
Figure 7D:
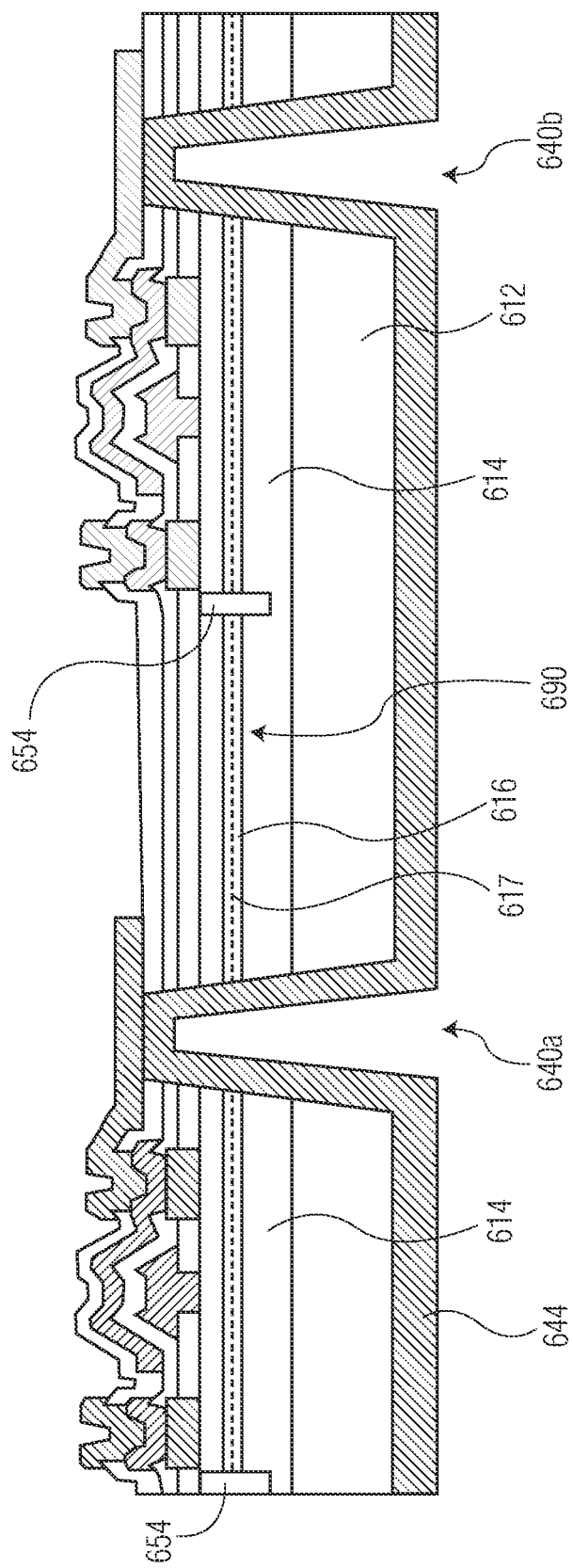

Referring now simultaneously to FIGS. 7B-7D, forming the transistor structures 651a and 651b and grid structure 604 of FIG. 6 includes forming the high resistivity regions 654. High resistivity regions 654 may be formed by forming a masking layer 655 over the structure 701 of FIG. 7A and then implanting an ion species through dielectric layer 622 and into the substrate 610 to create the high resistivity regions 654. During this step, the masking layer 655 is arranged to protect channel layer 616 so that portion 690 of channel 617 located within saw street 692 of wafer 500 is not destroyed during formation of high resistivity regions 654. According to an embodiment, high resistivity region 654 may be formed by implanting an ion species at an energy sufficient to drive the ion species through the first dielectric layer 622 and into the barrier layer 618, channel layer 616, and buffer layer 614, thus damaging the crystal lattice for these layers, disrupting the channel 617 and creating high resistivity regions 654 within the substrate 610. According to an embodiment, one of N, B, He, H, O, or a combination of these or one or a combination of other suitable ion species may be implanted to create high resistivity regions 654 below the upper surface 612 of the substrate 610. After formation of high resistivity region 654 and isolation regions 652a and 652b, masking layer 655 is removed using appropriate etchants or solvents.

In other embodiments (not shown), high resistivity region 654 may be formed by removing (e.g., etching) first dielectric layer 622, barrier layer 618, channel layer 616, and buffer layer 614 to remove a portion of channel 617 occupied by high resistivity region 654. This etching process can be controlled so as to not remove any portion of channel 617 underlying saw street 692 region of wafer 600. In these embodiments using etched isolation, the etching of semiconductor layers that overlie the host substrate 601 including barrier layer 618, channel layer 616, and buffer layer 614 may terminate within one of these layers. Alternatively, the etching may terminate on the upper surface 613 of the host substrate 601 or may extend into the host substrate 601, below the upper surface 613. In some embodiments, etching may be used in conjunction with ion implantation to create high resistivity region 654.

As depicted in FIG. 7C, formation of high resistivity regions 654 may be followed by forming ohmic contacts 662a and 662b on substrate 610. Ohmic contacts 662a and 662b may be used to form the source electrodes 660a and 660b and the drain electrodes 664a and 664b. Gate electrodes 670a and 670b are formed over substrate 610. Dielectric layer 624 is formed over gate electrodes 670a and 670b. Interconnect metal layers 666a and 666b and 668a and 668b are formed over dielectric layer 624 and ohmic contacts 662a and 662b. Dielectric layer 626 is formed over the second dielectric layer 624 and the interconnect metal layers 666 and 668.

Through-wafer vias 640a and 640b are formed within substrate 500. Back metal layer 644 may be formed within the through-wafer vias 640a and 640b as shown in FIG. 7D.

The semiconductor wafer 500 including devices 502 may then be further processed to singulate devices 502 from the wafer 500a long saw street 692.

Figure 8:
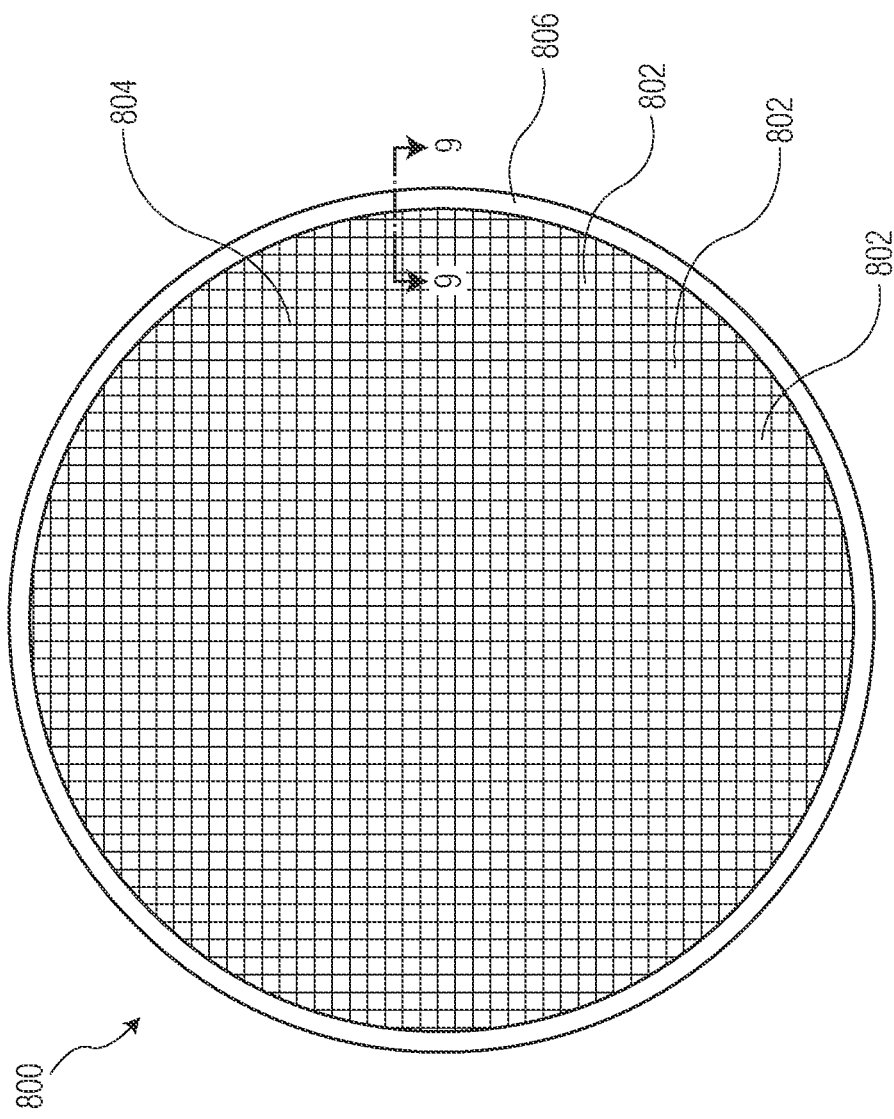
FIG. 8 is a top view of a wafer that includes a conductive ring formed around a perimeter of the wafer.

In some embodiments of the present system, an optional conductive ring may be formed around an exterior perimeter or at least a portion of a perimeter of wafer 100 or wafer 500 to provide a surface-mounted electrical interconnect to the grid structure formed therein. To illustrate, FIG. 8 is a top view of a wafer 800 that includes a conductive ring 806 formed around an exterior of wafer 800. Wafer 800 includes a number of devices 802 (e.g., devices 202, FIGS. 1, 2, 3, and 4D or 502, FIGS. 5, 6, 7D) formed over a surface of wafer 800. Grid structure 804 (e.g., grid structure 104, FIG. 1, grid structure 204, FIGS. 2, 3, 4B, 4C, 4D, and grid structure 504, FIGS. 5, 6, 7C, and 7D) is formed over wafer 800 and forms a conductive grid that may be formed around one or more of device 802 on wafer 800. Conductive ring 806 may be electrically connected to grid structure 104, as described herein. During processing of wafer 800, a reference voltage may be applied to conductive ring 806 (e.g., via electrical interconnect with a reference terminal provided on a piece of wafer 100 processing equipment) which, in turn, is applied to grid structure 804. In this manner, grid structure 804 may be grounded (e.g., electrically connected to a ground reference node) or otherwise set to a desired reference voltage.

Figure 9:
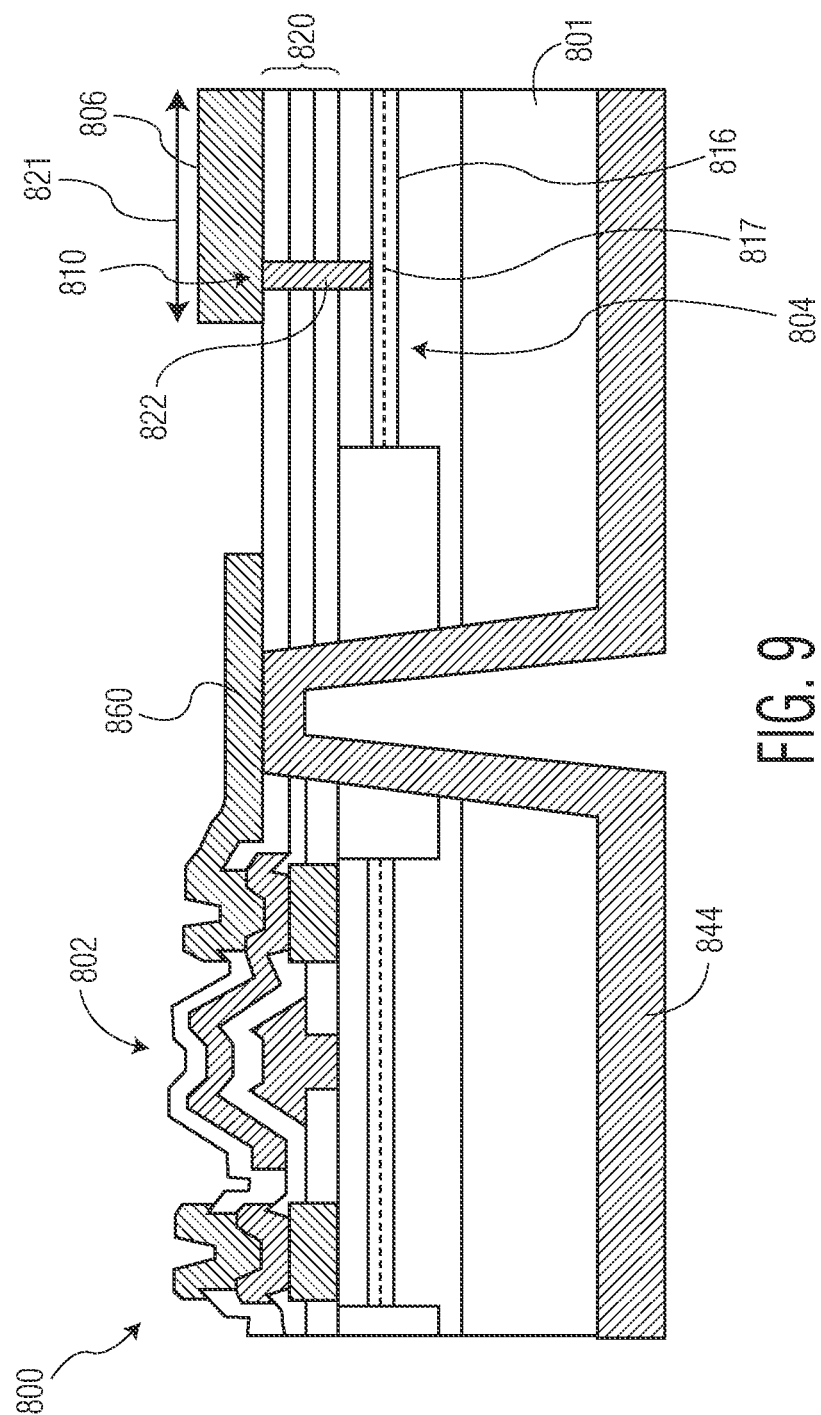
FIG. 9 is a cross-sectional view of the wafer of FIG. 8 depicting an edge of the wafer and showing detail of a grid structure.

FIG. 9 is a cross-sectional view of wafer 900 depicting an edge of wafer 800 and showing detail of grid structure 804 taken along line 9-9 of FIG. 8. Wafer 800 includes device 802 formed over host substrate 801 and grid structure 804. Device 802 may be configured and fabricated in the same manner as any of devices 202, FIGS. 1, 2, 3, and 4D or 502, FIGS. 5, 6, 7D and grid structure may be configured fabricated in the same manner as any of grid structure 104, FIG. 1, grid structure 204, FIGS. 2, 3, 4B, 4C, 4D, and grid structure 504, FIGS. 5, 6, 7C, and 7D.

Conductive ring 806 includes a conductive material and is fabricated or deposited over a top surface of insulating layer 820 (e.g., insulating layer 220, FIG. 3 or 620, FIG. 6). Conductive ring 806 may be selected from one or more of Au, Al, Ag, Cu, a combination of these, or other conductive material. A via 810 is formed through insulating layer 820 and filled with a conductive material to form via 822 that electrically connects conductive ring 806 to channel layer 816 (e.g., channel layer 216, FIGS. 3, 4A-4D, channel layer 616, FIGS. 6, 7A-7D) and the conductive channel 817 therein. In this manner, conductive ring 806 can be electrically connected to grid structure 804. As such, by subjecting conductive ring 806 to an electric potential, grid structure 804 may be set to that same electric potential throughout wafer 800. As such, when a ground reference voltage is connected to conductive ring 806, grid structure 804 may be grounded thereby providing protection against both the build-up of electrostatic charge within wafer 800 and discharge of electrostatic charge from wafer 800 during wafer 800 processing and fabrication or singulation. In embodiments, conductive ring 806 has a width 821 of 1-2 millimeters (mm), though conductive ring 806 may have a smaller or greater width depending on the application.

In embodiments, grid structure 804 may be grounded simultaneously via combinations of the connection of a ground reference voltage to conductive ring 806, wafer 800 front side connections (e.g., via source terminal 860 or common body of device 802) and wafer 800 back side connections (e.g., via back metal layer 844 of wafer 800). In this manner, several different approaches exist for connecting grid structure 804 to a reference voltage. As such, during wafer 800 fabrication, different components or machines utilized during wafer fabrication may established ground reference voltage connections to grid structure 804 using these different connections as they become available during fabrication.

Figure 10:
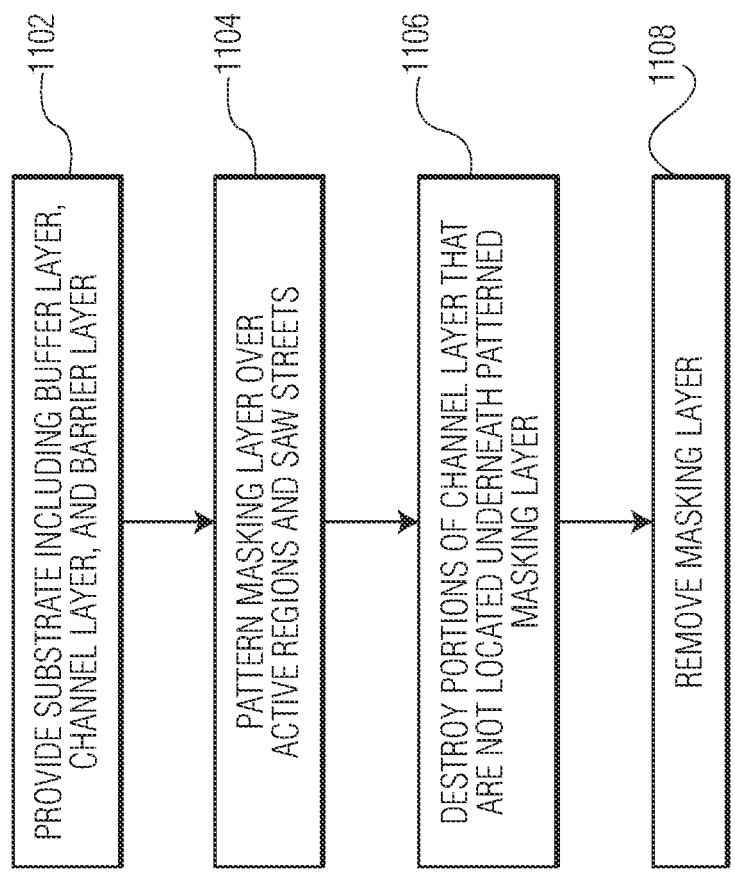
FIG. 10 is a flowchart depicting a method of fabricating a wafer, according to an embodiment.

FIG. 10 is a flowchart depicting a method for manufacturing a wafer with an integrated grid stricture (e.g., grid structure 104, FIG. 1, grid structure 204, FIGS. 2, 3, 4B, 4C, 4D, and grid structure 504, FIGS. 5, 6, 7C, and 7D). In a first step 1102, a semiconductor substrate (e.g., substrate 210, FIG. 3, substrate 610, FIG. 6) is provided. The substrate includes a buffer layer formed over the substrate, a channel layer over the buffer layer, and a barrier layer over the buffer layer. A conductive channel (e.g., conductive channel 217, FIG. 3, conductive channel 617, FIG.) is formed within the channel layer at the interface between the channel layer and the barrier layer. The conductive channel may include a 2-DEG layer.

In step 1104, a masking layer (e.g., masking layer 255, FIG. 3, masking layer 655, FIG. 6) is formed over the substrate. The masking layer is patterned over active regions of the substrate and over at least a portion of a saw street region defined over the substrate.

In step 1106, portions of the channel layer that are within the substrate and are not located underneath the patterned regions of the masking layer are destroyed, either by ion implantation or mechanical etching. After performing this step, a grid structure comprising conductive regions of channel layer is formed. In step 1108, the masking layer is removed.

With the grid structure formed, the grid structure may be connected to a ground reference voltage to prevent electrostatic charge build-up within the action regions of the substrate and any electronic devices formed therein. In embodiments where transistors are formed within the active regions of the substrate and the grid structure is electrically connected to terminals of those transistor devices (e.g., as in the embodiment shown in FIG. 6), the grid structure can be connected to a ground reference by connecting one or more of the terminals to the ground reference voltage. Alternatively, a conductive structure, such as a conductive ring (e.g., conductive ring 806 of FIG. 8) may be formed over the substrate and electrically connected to the grid structure (e.g., using a conductive via such as via 822 of FIG. 9). The conductive structure than then itself be connected to a ground reference voltage as a means of connected to the grid structure to the ground reference voltage.

In an embodiment, a wafer includes a substrate that includes a channel layer, a first active region, a second active region, and a saw street region between the first active region and the second active region. The wafer includes a first device formed on the substrate in the first active region. The first device includes a first portion of the channel layer. The wafer includes a second device formed on the substrate in the second active region. The second device includes a second portion of the channel layer. The wafer includes a conductive channel between the first active region and the second active region. The conductive channel is in the saw street of the wafer and includes a third portion of the channel layer.

The conductive channel may not include a metal. The wafer may include a barrier layer over the channel layer and wherein the conductive channel includes a two-dimensional electron gas along an interface between the channel layer and the barrier layer. The conductive channel may extend around a perimeter of at least one of the first active region and the second active region. The wafer may include a conductive ring over the substrate, wherein the conductive ring extends around a perimeter of the substrate and is electrically connected to the third portion of the channel layer. The third portion of the channel layer may be electrically isolated from the first portion of the channel layer by a first high resistivity region of the wafer, and the third portion of the channel layer may be electrically isolated from the second portion of the channel layer by a second high resistivity region of the wafer. The first device may be a transistor having a current carrying electrode and the third portion of the channel layer may be electrically connected to the current carrying electrode. The third portion of the channel layer may extend underneath the current carrying electrode of the first device. The current carrying electrode may be a source electrode of the transistor.

In an embodiment, a device includes a substrate that includes a channel layer, a first active region formed on the substrate, wherein the first active region includes a first portion of the channel layer, a second active region formed on the substrate, wherein the second active region includes a second portion of the channel layer, and a conductive channel between the first active region and the second active region, wherein the conductive channel includes a third portion of the channel layer, wherein the third portion of the channel layer is electrically isolated from the first portion of the channel layer, and the third portion of the channel layer is electrically isolated from the second portion of the channel layer.

The conductive channel may include a semiconducting material. The device may include a barrier layer over the channel layer and the conductive channel may include a two-dimensional electron gas along an interface between the channel layer and the barrier layer. The conductive channel may extend around a perimeter of at least one of the first active region and the second active region. The device may include a conductive ring on the substrate, wherein the conductive ring extends around at least a portion of a perimeter of the substrate and is electrically connected to the third portion of the channel layer.

In an embodiment, a method includes forming a channel layer in a substrate and forming high resistivity regions in the substrate to define a first active region in the substrate, a second active region in the substrate, a first portion of the channel layer, a second portion of the channel layer, and a third portion of the channel layer. The first active region includes the first portion of the channel layer, the second active region includes the second portion of the channel layer. The third portion of the channel layer is between the first active region and the second active region, and the first portion of the channel layer is electrically isolated from the third portion of the channel layer. The method may include forming a barrier layer over the channel layer to create a two-dimensional electron gas along an interface between the channel layer and the barrier layer. The method may include forming a conductive ring around at least a portion of a perimeter of the substrate and electrically connecting the conductive ring to the third portion of the channel layer. The method may include electrically connecting the conductive ring to a ground reference voltage. The method may include forming a first device in the first active region and a second device in the second active region and cutting the substrate through at least a portion of the conductive channel to separate the first device from the second device. The method may include forming the high resistivity regions by etching through the channel layer.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein the terms "substantial" and "substantially" mean sufficient to accomplish the stated purpose in a practical manner and that minor imperfections, if any, are not significant for the stated purpose. Also as used herein, the terms "approximately" and "about" mean a value close to or within an acceptable range of an indicated value, amount, or quality, which also includes the exact indicated value itself.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:
1. A wafer, comprising:
   a substrate that includes a channel layer, a first active region, a second active region, and a saw street region between the first active region and the second active region;

a first device formed on the substrate in the first active region, wherein the first device includes a first portion of the channel layer;

a second device formed on the substrate in the second active region, wherein the second device includes a second portion of the channel layer; and a conductive channel between the first active region and the second active region, wherein the conductive channel is in the saw street of the wafer and includes a third portion of the channel layer, wherein a dielectric layer is formed over the entire first portion, second portion, and third portion of the channel layer, and wherein a conductive via pad extends over the dielectric layer, connecting a back metal layer through a high resistivity region separating the first portion of the channel region and the second portion of the channel region.

2. The wafer of claim 1, wherein the conductive channel does not include a metal.

3. The wafer of claim 1, further comprising a barrier layer over the channel layer and wherein the conductive channel includes a two-dimensional electron gas along an interface between the channel layer and the barrier layer.

4. The wafer of claim 1, wherein the conductive channel extends around a perimeter of at least one of the first active region and the second active region.

5. The wafer of claim 1, further comprising a conductive ring over the substrate, wherein the conductive ring extends around a perimeter of the substrate and is electrically connected to the third portion of the channel layer.

6. The wafer of claim 1, wherein the third portion of the channel layer is electrically isolated from the first portion of the channel layer by a first high resistivity region of the wafer, and the third portion of the channel layer is electrically isolated from the second portion of the channel layer by a second high resistivity region of the wafer.

7. The wafer of claim 1, wherein the first device is a transistor having a current carrying electrode and the third portion of the channel layer is electrically connected to the current carrying electrode.

8. The wafer of claim 7, wherein the third portion of the channel layer extends underneath the current carrying electrode of the first device.

9. The wafer of claim 7, wherein the current carrying electrode is a source electrode of the transistor.

10. A device, comprising:

a substrate that includes a channel layer;

a first active region formed on the substrate, wherein the first active region includes a first portion of the channel layer;

a second active region formed on the substrate, wherein the second active region includes a second portion of the channel layer;

a conductive channel between the first active region and the second active region, wherein the conductive channel includes a third portion of the channel layer, wherein the third portion of the channel layer is electrically isolated from the first portion of the channel layer in a planar region, and the third portion of the channel layer is electrically isolated from the second portion of the channel layer; and a dielectric layer formed over the first portion, second portion, and third portion of the channel layer, wherein a conductive via pad extends over the dielectric layer, connecting a back metal layer through a high resistivity region separating the first portion of the channel region and the second portion of the channel region.

11. The device of claim 10, wherein the conductive channel includes a semiconducting material.

12. The device of claim 11, further comprising a barrier layer over the channel layer and wherein the conductive channel includes a two-dimensional electron gas along an interface between the channel layer and the barrier layer.

13. The device of claim 10, wherein the conductive channel extends around a perimeter of at least one of the first active region and the second active region.

14. The device of claim 10, further comprising a conductive ring on the substrate, wherein the conductive ring extends around at least a portion of a perimeter of the substrate and is electrically connected to the third portion of the channel layer.

* * * * *